(12) United States Patent
Ookura

(10) Patent No.: US 10,002,807 B2
(45) Date of Patent: Jun. 19, 2018

(54) SEMICONDUCTOR DEVICE

(71) Applicant: DENSO CORPORATION, Kariya, Aichi-pref. (JP)

(72) Inventor: Yasushi Ookura, Okazaki (JP)

(73) Assignee: DENSO CORPORATION, Kariya (JP)

( * ) Notice: Subject to any disclaimer, the term of this patent is extended or adjusted under 35 U.S.C. 154(b) by 170 days.

(21) Appl. No.: 14/432,368

(22) PCT Filed: Oct. 21, 2013

(86) PCT No.: PCT/JP2013/006208
§ 371 (c)(1),
(2) Date: Mar. 30, 2015

(87) PCT Pub. No.: WO2014/073168
PCT Pub. Date: May 15, 2014

(65) Prior Publication Data
US 2015/0221566 A1    Aug. 6, 2015

(30) Foreign Application Priority Data

Nov. 6, 2012  (JP) ................... 2012-244712

(51) Int. Cl.
*G01R 31/02* (2006.01)
*G01R 31/26* (2014.01)
(Continued)

(52) U.S. Cl.
CPC .............. *H01L 22/32* (2013.01); *H01L 22/14* (2013.01); *H01L 27/088* (2013.01);
(Continued)

(58) Field of Classification Search
CPC ............ G01R 31/2621; G01R 31/2884; G01R 31/275; G01R 31/26; G01R 31/31858; G01R 19/16519; H01L 22/32
(Continued)

(56) References Cited

U.S. PATENT DOCUMENTS 6,737,705 B2 * 5/2004 Momota ............. H01L 29/7397
                                                           257/139
8,779,523 B2 * 7/2014 Shirai ............. H01L 21/823814
                                                           257/343
(Continued)

FOREIGN PATENT DOCUMENTS

JP         8-191145 A     7/1996
JP     2001-352066 A    12/2001
(Continued)

OTHER PUBLICATIONS

International Search Report and Written Opinion of the International Searching Authority dated Dec. 17, 2013 in the corresponding PCT application No. PCT/JP2013/006208 (and English translation).
(Continued)

*Primary Examiner* — Giovanni Astacio-Oquendo
(74) *Attorney, Agent, or Firm* — Posz Law Group, PLC

(57) ABSTRACT

A semiconductor device includes a semiconductor substrate on which plural gate electrodes are juxtaposed to each other, plural gate wirings formed on the semiconductor substrate, plural gate pads, a first pad, and a second pad. The adjacent gate electrodes define plural cells, and the plural cells include plural transistor cells. The plural gate electrodes are partitioned into plural types by the plural gate wirings. The plural transistor cells are partitioned into plural types according to a combination of the defined gate electrodes.

18 Claims, 16 Drawing Sheets

(51) Int. Cl.
*H01L 21/66* (2006.01)
*H01L 29/739* (2006.01)
*H01L 29/06* (2006.01)
*H01L 27/088* (2006.01)

(52) U.S. Cl.
CPC ...... *H01L 29/0696* (2013.01); *H01L 29/7397* (2013.01); *G01R 31/2621* (2013.01); *H01L 2924/0002* (2013.01)

(58) Field of Classification Search
USPC ................ 324/762.09, 500, 537, 762.01
See application file for complete search history.

(56) References Cited

U.S. PATENT DOCUMENTS

| | | | | |
|---|---|---|---|---|
| 2005/0230720 | A1* | 10/2005 | Miyagawa | H01L 27/14603 257/292 |
| 2006/0237795 | A1* | 10/2006 | Kato | H01L 21/823814 257/360 |
| 2009/0001411 | A1* | 1/2009 | Tokura | H01L 27/0664 257/140 |
| 2011/0193132 | A1* | 8/2011 | Kouno | H01L 29/0619 257/139 |
| 2016/0035903 | A1* | 2/2016 | Okachi | H01L 29/78603 257/66 |
| 2016/0056810 | A1* | 2/2016 | Kouno | H03K 17/0828 327/432 |
| 2016/0087094 | A1* | 3/2016 | Takaya | H01L 29/7813 257/48 |

FOREIGN PATENT DOCUMENTS

| | | | |
|---|---|---|---|
| JP | 2003-060040 A | | 2/2003 |
| JP | 2006-071467 A | | 3/2006 |
| JP | 2006-284490 A | | 10/2006 |
| JP | 2008-306047 A | * | 12/2008 |
| JP | 2009-128189 A | | 6/2009 |
| JP | 2010-109545 A | | 5/2010 |
| JP | 2012-042281 A | | 3/2012 |

OTHER PUBLICATIONS

Office Action dated Nov. 11, 2014 in the corresponding JP application No. 2012-244712 (and English translation).

* cited by examiner

PRIOR ART

SEMICONDUCTOR DEVICE

CROSS REFERENCE TO RELATED APPLICATIONS

This disclosure is a U.S. national stage application of PCT/JP2013/006208 filed on Oct. 21, 2013 and is based on Japanese Patent Application No. 2012-244712 filed Nov. 6, 2012, the entire contents of which are incorporated herein by reference.

TECHNICAL FIELD

This disclosure relates to a semiconductor device including a semiconductor substrate with plural transistor cells.

BACKGROUND ART

Up to now, semiconductor devices including a semiconductor substrate in which plural gate electrodes are juxtaposed, and plural transistor cells are included as cells defined by adjacent gate electrodes have been known. The semiconductor device has gate wirings electrically connected to the gate electrodes on a first surface of the semiconductor substrate, and the gate wirings are connected with gate pads as external connection terminals. In addition, a first pad common to the plural transistor cells is formed on the first surface of the semiconductor substrate, and a second pad common to the plural transistor cells is formed on the first surface of the semiconductor substrate, or on a second surface opposite to the first surface. For example, when a vertical IGBT is formed in each of the transistor cells, the first pad is an emitter pad, and the second pad is a collector pad formed on the second surface.

In the semiconductor device of this type, for example, in order to ensure operation at high current density, a predetermined voltage is applied between the first pad and the second pad, and a large current, for example, several hundreds A are allowed to flow therebetween to implement screening. In a conventional method of bringing the plural probes into contact with the first pad for energization, in order to increase a test current, there is no choice but to increase the number of probes, or to increase current per probe. However, when the current per probe increases, a local current concentration caused by contact variation between an inspection device and the pad is more likely to occur. In addition, when the number of probes increases, the current concentration is likely to occur due to height variation of the probe. Furthermore, an increase in the number of probes is limited by the size of the first pad.

On the contrary, in PTL 1, a semiconductor element is arranged on a support base so as to come into contact with the second pad (collector electrode), a contact is brought into contact with each gate pad (gate electrode), and a conductive resin is brought into contact with the first pad (emitter electrode). A conductor and a weighting mechanism are placed on the conductive resin, and the conductor, the conductive resin, and the semiconductor element, which are disposed below the weighting mechanism, are weighed by the weighting mechanism so that the contact area increases to suppress the current concentration.

However, the inspection device used in PTL 1 is a device and a method using the conductive resin which are special as compared with general inspection devices used for screening, and increases the costs since the throughput becomes poor.

CITATION LIST

Patent Literature

PTL 1: JP 2009-128189 A

SUMMARY OF INVENTION

This disclosure has been made in view of the above problems, and aims at providing a semiconductor device and an inspection method which are capable of suppressing a local current concentration even without the use of a special inspection device in screening at a high current density.

According to an aspect of this disclosure, there is provided a semiconductor device including a semiconductor substrate, plural gate wirings, plural gate pads, a first pad, and a second pad. The semiconductor substrate has a first surface and a second surface located opposite to the first surface in a thickness direction, and includes plural gate electrodes juxtaposed in a first direction orthogonal to the thickness direction. The adjacent gate electrodes define the plural cells, and the plural cells include plural transistor cells.

The plural gate wirings are formed on the first surface of the semiconductor substrate, and are electrically connected to the plural gate electrodes. The plural gate pads are formed on the first surface of the semiconductor substrate, and are electrically connected to the plural gate electrodes through the plural gate wirings.

The first pad is formed on the first surface of the semiconductor substrate, and is common to the plural transistor cells. The second pad is formed on the first surface or the second surface of the semiconductor substrate, and is common to the plural transistor cells.

The plural gate wirings electrically partitioned from each other are connected to the respective gate pads. The plural gate electrodes are electrically partitioned into plural types by the plural gate wirings. The plural transistor cells are partitioned into the plural types according to the combination of the defined gate electrodes.

The semiconductor device is capable of suppressing the local current concentration even without the use of a special inspection device in screening at a high current density.

In addition, in the semiconductor device, a drive signal is selectively input to the plural gate pads in a state where a predetermined voltage is applied between the first pad and the second pad, thereby being capable of sequentially inspecting the plural transistor cells partitioned into the plural types.

BRIEF DESCRIPTION OF DRAWINGS

The above and other objects, features and advantages of the present disclosure will become more apparent from the following detailed description made with reference to the accompanying drawings. In the drawings.

DESCRIPTION OF EMBODIMENTS

Hereinafter, embodiments of this disclosure will be described with reference to the drawings. In the following respective drawings, parts identical with or equivalent to each other are denoted by the same symbols. In the following description, a thickness direction of a semiconductor substrate is indicated merely as a thickness direction, and a juxtaposed direction of gate electrodes in directions perpendicular to the thickness direction is indicated as a first direction. In addition, a direction orthogonal to both directions of the thickness direction and the first direction is indicated as a second direction.

First Embodiment

First, an outline configuration of a semiconductor element 10d will be described with reference to FIGS. 1 and 2. The semiconductor element 10d illustrated in this embodiment is used as a power switching element of, for example, a hybrid vehicle (HV) inverter module. The semiconductor element 10d corresponds to a semiconductor device.

Figure 1:
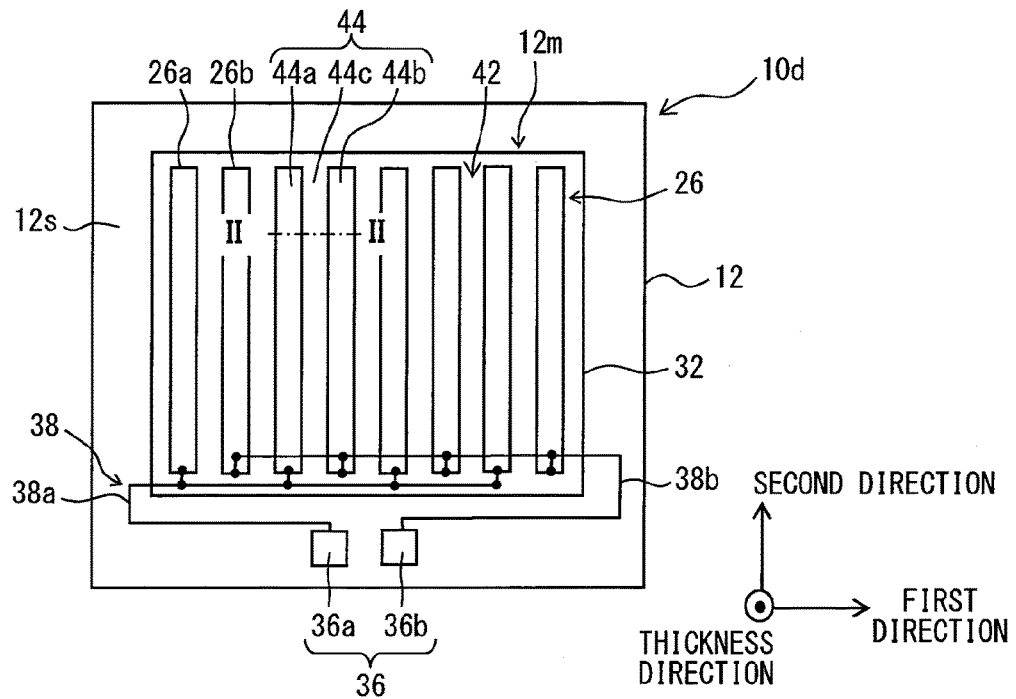
FIG. 1 is a plan view illustrating a semiconductor element according to a first embodiment.

As illustrated in FIG. 1, the semiconductor element 10d includes one semiconductor substrate 12 (semiconductor chip) having a first surface 12a and a second surface 12b opposite to the first surface 12a in the thickness direction. The semiconductor substrate 12 includes a main region 12m in which the element is formed, and an outer peripheral region 12s that surrounds the main region 12m, and for example, a guard ring not shown is formed in the outer peripheral region 12s for the purpose of ensuring a breakdown voltage. In this embodiment, an N-channel type insulated gate bipolar transistor (IGBT) is formed as the element.

The semiconductor substrate 12 has a P+ type collector layer 14 in a surface layer of the second surface 12b side, and also has an N-type buffer layer 16 on the collector layer 14. The semiconductor substrate 12 also has an N-type drift layer 18 lower in impurity concentration than the buffer layer 16 on the buffer layer 16. The semiconductor substrate 12 has a P-type base layer 20 on the drift layer 18 in the main region 12m. The base layer 20 is formed in a surface layer of the semiconductor substrate 12 on the first surface 12a side. As described above, the collector layer 14, the buffer layer 16, the drift layer 18, and the base layer 20 are laminated in the main region 12m in the stated order.

In addition, each trench 22 that reaches the drift layer 18 from the first surface 12a through the base layer 20 is formed in the semiconductor substrate 12. The trench 22 is provided in a substantially rectangular annular shape having a predetermined depth in the thickness direction as described above, and also having a second direction as a longitudinal direction and a first direction as a lateral direction. Furthermore, a plurality of the trenches 22 is formed repetitively at the same pitches in the first direction.

A gate insulating film 24 is formed on a side wall of each trench 22, and the trench 22 is filled with a conductive material such as polysilicon through the gate insulating film 24. Each gate electrode 26 is made of the filled conductive material. For that reason, the gate electrode 26 follows a shape of the trench 22, and is formed into a substantially rectangular annular shape in a plane perpendicular to the thickness direction. The plural gate electrodes 26 are juxtaposed in the first direction. In addition, in this embodiment, the gate electrodes 26 include first gate electrodes 26a and second gate electrodes 26b which are electrically partitioned in correspondence with gate pads 36 to be described later.

Sides of each trench 22 of the surface layer of the first surface 12a side in the base layer 20 are formed with N+ type emitter regions 28 higher in impurity concentration than the drift layer 18. In addition, a P+ type base contact region 30 higher in the impurity concentration than the base layer 20 is formed between the adjacent trenches 22 in the first direction, and between the emitter regions 28 formed on the sides of each trench 22. In this embodiment, the emitter regions 28 are respectively formed on both sides of all the gate electrodes 26 juxtaposed in the first direction. In addition, base contact regions 30 are discontinuously formed at predetermined pitches in the second direction. In other words, the base contact regions 30 are intermittently formed, and the emitter regions 28 are arranged in portions where the base contact regions 30 are not present. The base contact regions 30 are each formed from the first surface 12a to a position deeper than the emitter regions 28.

An interlayer insulating film not shown is formed on the first surface 12a of the semiconductor substrate 12, and an emitter electrode is formed as a first pad 32 on the interlayer insulating film. The first pad 32 is formed in correspondence with the above-mentioned main region 12*m*. The first pad 32 is electrically connected to the emitter regions 28 and the base contact regions 30 through a contact holes 34 formed in the interlayer insulating film.

The gate pads 36 are also formed on an interlayer connection film in the outer peripheral region 12*s*. The gate pads 36 are electrically connected to the gate electrodes 26 through gate wirings 38 formed on the interlayer connection film. In this embodiment, the gate pads 36 include a first gate pad 36*a* and a second gate pad 36*b* which are electrically partitioned from each other. The gate wirings 38 include a first gate wiring 38*a* and a second gate wiring 38*b* which are electrically partitioned from each other. Each of the first gate electrodes 26*a* is electrically connected to the first gate pad 36*a* through the first gate wiring 38*a*. Also, each of the second gate electrodes 26*b* is electrically connected to the second gate pad 36*b* through the second gate wiring 38*b*.

Figure 2:
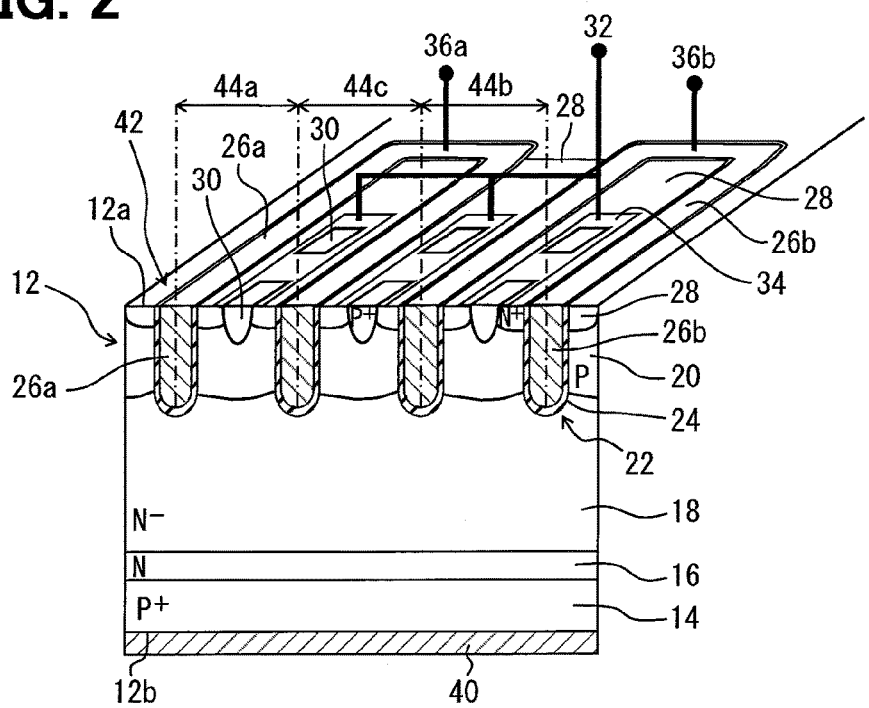
FIG. 2 is a perspective cross-sectional view of the semiconductor element taken along a line II-II in FIG. 1.

As illustrated in FIGS. 1 and 2, the first gate electrodes 26*a* and the second gate electrodes 26*b* are alternately disposed in the first direction. Because each of the gate electrodes 26 (26*a*, 26*b*) is formed into the substantially rectangular annular shape in a plane, the first gate electrodes 26*a* and the second gate electrodes 26*b* are arranged two by two from the viewpoint of the gate electrodes 26 juxtaposed in the first direction as illustrated in FIG. 2.

On the other hand, a collector electrode is formed as a second pad 40 on the second surface 12*b* of the semiconductor substrate 12, and the second pad 40 is electrically connected to the collector layer 14.

The main region 12*m* of the semiconductor substrate 12 is partitioned into plural cells 42 by the gate electrodes 26 juxtaposed in the first direction. That is, the cells 42 are defined by the gate electrodes 26 adjacent to each other in the first direction. In this embodiment, one cell 42 is formed between centers of the adjacent gate electrodes 26. The cells 42 include plural transistor cells 44. In this embodiment, all of the cells 42 are formed by the transistor cells 44. The transistor cells 44 include a first transistor cell 44*a* that is defined by the annular first gate electrode 26*a*, that is, the two first gate electrodes 26*a* juxtaposed in the first direction. In addition, the transistor cells 44 include a second transistor cell 44*b* that is defined by the annular second gate electrode 26*b*, that is, the two second gate electrodes 26*b* juxtaposed in the first direction. Further, the transistor cells 44 include a third transistor cell 44*c* that is defined by the first gate electrode 26*a* and the second gate electrode 26*b* which are adjacent to each other. In the first direction, the first transistor cell 44*a*, the third transistor cell 44*c*, the second transistor cell 44*b*, the third transistor cell 44*c*, and the first transistor cell 44*a* are arranged in the stated order.

Figure 3:
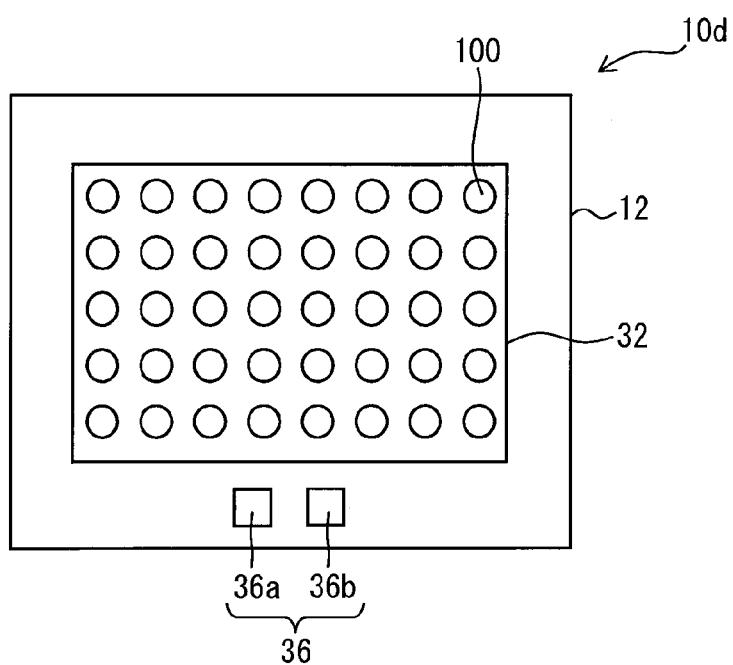
FIG. 3 is a diagram illustrating inspection by a probe contact.

Subsequently, a method of investigating an electric characteristic of the above semiconductor element 10*d* will be described with reference to FIG. 3.

In this embodiment, in order to ensure operation at high current density, a predetermined voltage is applied between the first pad 32 and the second pad 40, and a drive signal is supplied to the gate pads 36 in this applied state to allow a large current, for example, several hundreds A to flow in the semiconductor element 10*d*. As a result, screening is implemented.

Specifically, the semiconductor element 10*d* is arranged on an energizable support base not shown, for example, so that the second pad 40 comes into contact with the support base. A probe 100 of a tester is brought into contact with the first pad 32 to apply a predetermined voltage between the first pad 32 and the second pad 40. For example, one probe 100 enables the supply of 10 A, and in FIG. 3, the supply of 400 A is enabled by 40 probes 100. In this applied state, a drive signal is supplied to the gate pads 36. In this embodiment, the drive signal is first supplied to the first gate pad 36*a*, and the drive signal is thereafter supplied to the second gate pad 36*b*.

Subsequently, a description will be given of the operation and effects of the semiconductor element 10*d* configured as described above.

In this embodiment, the semiconductor element 10*d* includes the first gate pad 36*a* and the second gate pad 36*b*. The first gate pad 36*a* is electrically connected with the first gate electrodes 26*a*, and the second gate pad 36*b* is electrically connected with the second gate electrodes 26*b*. On the other hand, the first pad 32 and the second pad 40 are shared by the plural transistor cells 44.

Figure 4:
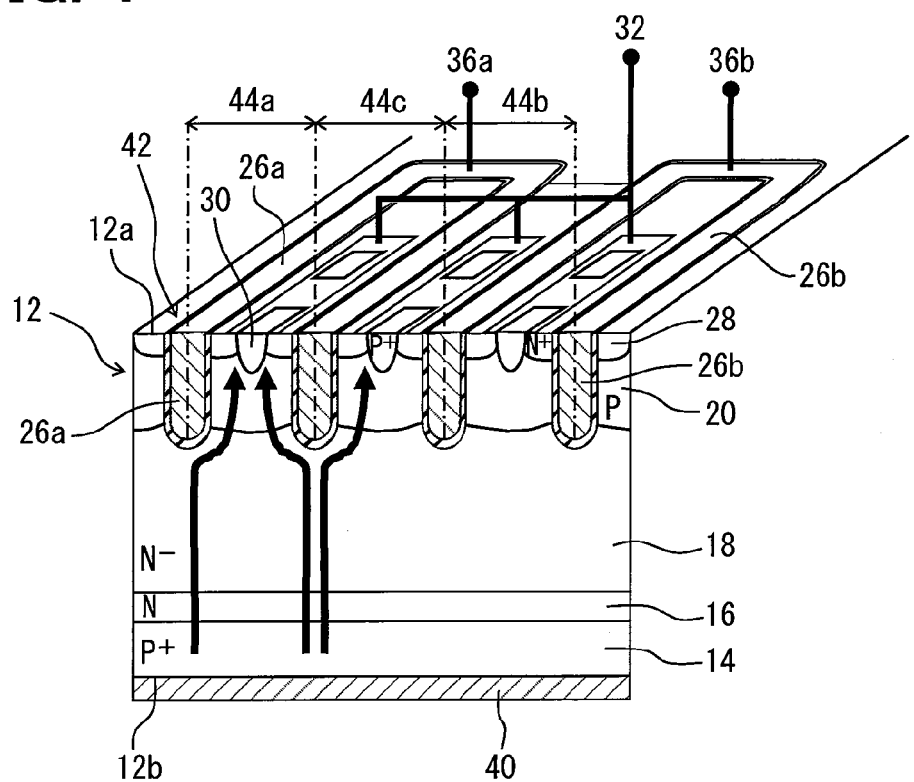
FIG. 4 is a diagram illustrating a first inspection process.

Therefore, when the drive signal is selectively input to the first gate pad 36*a* in a state where a predetermined voltage is applied between the first pad 32 and the second pad 40, channels are formed in the vicinity of the first gate electrodes 26*a*. Specifically, as illustrated in FIG. 4, the channels are formed on both sides of the first transistor cell 44*a*, and the first gate electrodes 26*a* side of the third transistor cell 44*c* in the first direction. Therefore, a current (collector current) flows as indicated by solid arrows in FIG. 4. The first transistor cell 44*a* and half of the third transistor cell 44*c* can be inspected through this first inspection process.

Figure 5:
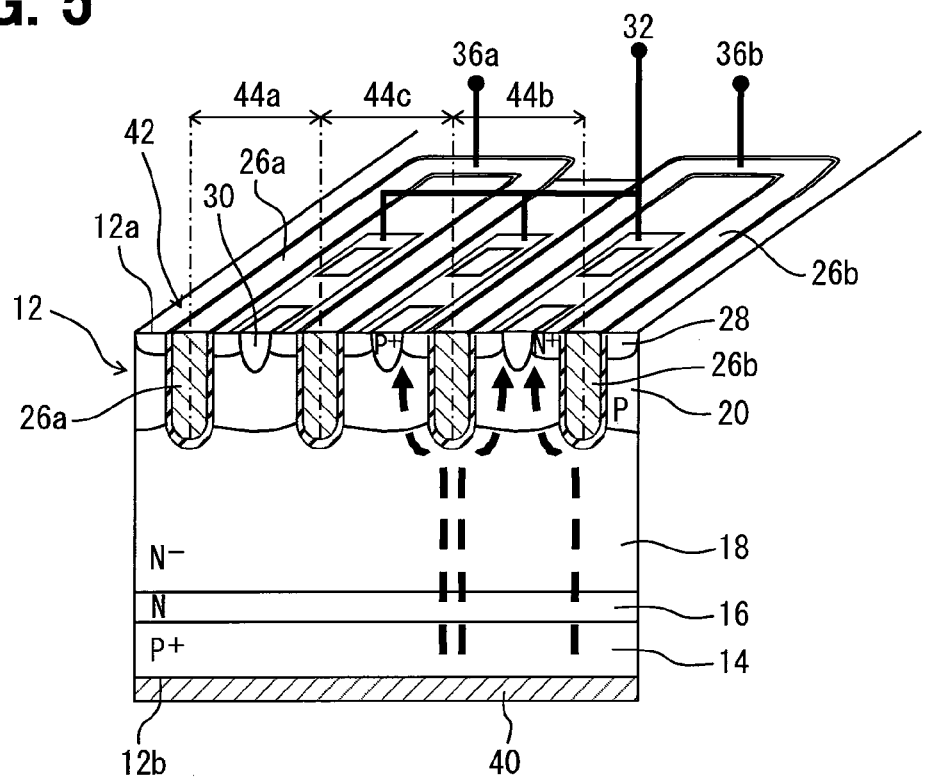
FIG. 5 is a diagram illustrating a second inspection process.

On the other hand, when the drive signal is selectively input to the second gate pad 36*b* in a state where the predetermined voltage is applied between the first pad 32 and the second pad 40, channels are formed in the vicinity of the second gate electrodes 26*b*. Specifically, as illustrated in FIG. 5, the channels are formed on both sides of the second transistor cell 44*b*, and the second gate electrode 26*b* side of the third transistor cell 44*c* in the first direction. Therefore, a current (collector current) flows as indicated by dashed arrows in FIG. 5. The second transistor cell 44*b* and the remaining half of the third transistor cell 44*c* can be inspected through this second inspection process.

As described above, in this embodiment, 400 A can be supplied to half of the plural transistor cells 44 per inspection. Therefore, as compared with a case in which 400 A is supplied to all of the plural transistors 44, a current density of the transistor cells 44 (44*a*, 44*b*, 44*c*) can increase. That is, even if a current that is supplied between the first pad 32 and the second pad 40 is smaller than that in the conventional art, a high current density can be ensured for the transistor cells 44. In the case of obtaining the comparable current density, since the current may be smaller than that in the conventional art, the local current concentration can be suppressed.

In addition, with the selection of the gate pads 36*a* and 36*b*, the plural types of transistor cells 44*a*, 44*b*, and 44*c* can be sequentially inspected. That is, all of the transistor cells 44 can be inspected at a high current density. As a result, the local current concentration can be suppressed even without using a special inspection device in screening at the high current density.

In addition, since the high current density can be ensured with the small current by two types of gate pads 36*a*, 36*b*, and gate wirings 38*a*, 38*b*, the gate pads 36 and the gate wirings 38 can be simplified.

The plural types of transistor cells 44*a*, 44*b*, and 44*c* are periodically arranged in the first direction. In detail, the first transistor cells 44*a* and the second transistor cells 44*b* are alternately disposed one by one, and the respective third transistor cells 44*c* are interposed between the first transistor cells 44*a* and the second transistor cells 44*b*. According to this configuration, as compared with a configuration in which the same type of transistor cells 44 is densely arranged, a bias of current that flows in the probe 100 can be suppressed.

In this embodiment, the semiconductor element 10*d* has only one first pad 32. However, this embodiment can be also applied to a configuration in which the first pad 32 is divided into plural pads. In this case, the gate pads 36 are commonly electrically connected to the gate electrodes 26 of the transistor cells 44 directly under each of the first pads 32. That is, for example, in the case of providing two first pads 32, when the transistor cells 44 directly under one first pad 32 are connected to the gate pads 36*a* and 36*b*, the transistor cells 44 directly under the other first pad 32 are also connected to the gate pads 36*a* and 36*b*.

In this embodiment, one gate wiring 38 is connected to each gate pad 36. However, plural gate wirings 38 may be connected to the common gate pad 36. For example, two first gate wirings 38*a* may be connected to the first gate pad 36*a*, and two second gate wirings 38*b* may be connected to the second gate pad 36*b*. In this case, for example, one first gate wiring 38*a* is connected to a part of the plural first gate electrodes 26*a*, and the other first gate wiring 38*a* may be connected to the remaining first gate electrodes 26*a*. The plural gate pads 36 may be connected to a common gate wiring 38. For example, two first gate pads 36*a* may be connected to the first gate wiring 38*a*, and two second gate pads 36*b* may be connected to the second gate wiring 38*b*. That is, the semiconductor element 10*d* may have plural gate systems electrically independent from each other, which extend from the gate pads 36 to the gate electrodes 26 through the gate wirings 38.

(First Modification)

Figure 6:
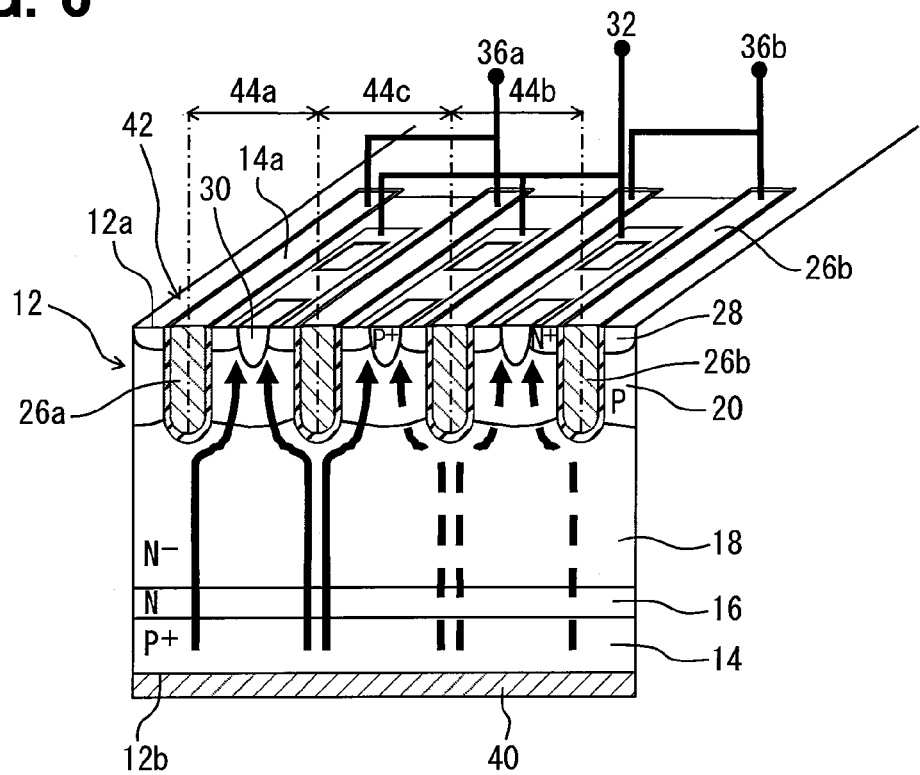
FIG. 6 is a perspective cross-sectional view of a semiconductor element according to a first modification.

In the first embodiment, a planar shape of the gate electrodes 26 is substantially rectangular annular. However, for example, as illustrated in FIG. 6, this embodiment can be also applied to the semiconductor element 10*d* having the linear gate electrodes 26 extending along the second direction. The plural gate electrodes 26 illustrated in FIG. 6 are arranged in stripes. In the first direction, the first gate electrodes 26*a* and the second gate electrodes 26*b* are alternately disposed two by two. The other configurations are identical with those in the above embodiment.

For convenience, FIG. 6 illustrates the current (sold arrows) that flows in the first inspection process, and the current (dashed arrows) that flows in the second inspection process together.

Second Embodiment

In this embodiment, parts common to those in the above embodiment will be omitted from the description.

Figure 7:
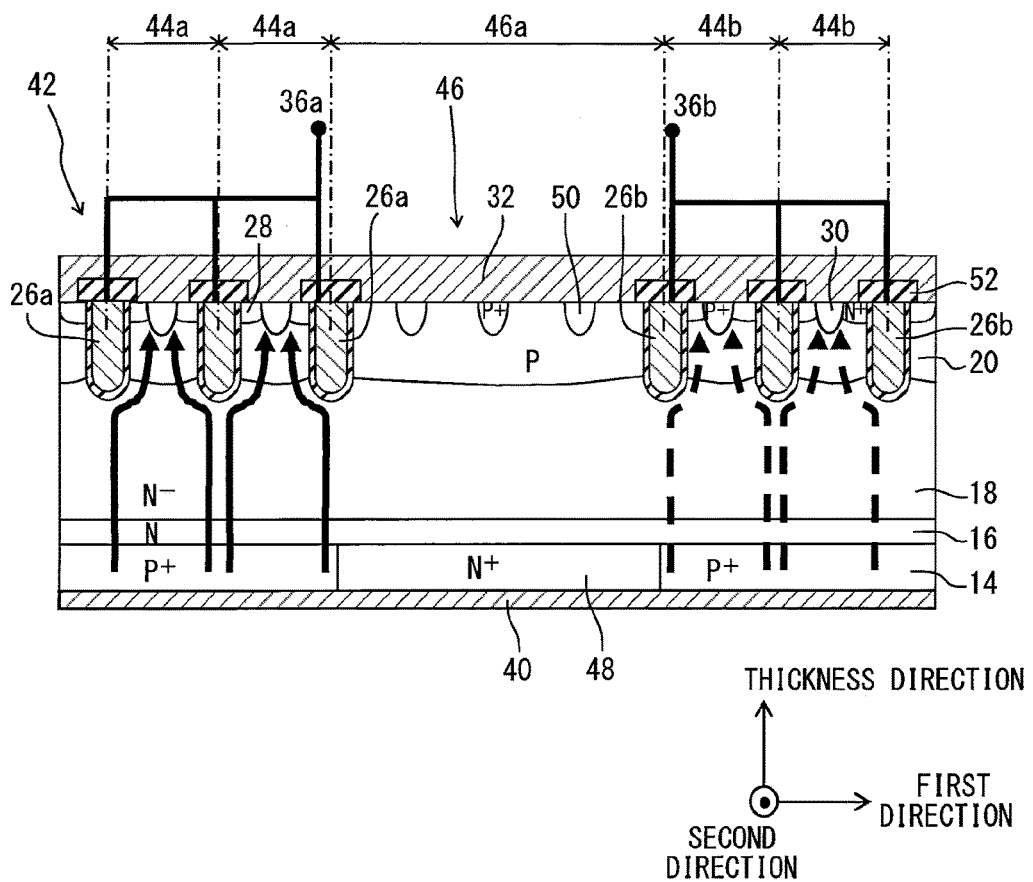
FIG. 7 is a cross-sectional view of a semiconductor element according to a second embodiment.

The feature of this embodiment resides in that, as illustrated in FIG. 7, the semiconductor element 10*d* includes a separation cell 46 that does not function as a transistor as the cell 42 defined by the first gate electrodes 26*a* and the second gate electrodes 26*b* which are adjacent to each other.

In particular, in FIG. 7, the separation cell 46 forms a diode cell 46*a* that is electrically connected to the first pad 32 and the second pad 40. That is, in the main region 12*m* of the semiconductor substrate 12, the transistor cells 44 are arranged in parallel to the diode cell 46*a*. When attention is focused on the transistor cell 44, the first transistor cells 44*a* and the second transistor cells 44*b* are alternately disposed two by two. The diode cell 46*a* is interposed between the first transistor cell 44*a* and the second transistor cell 44*b* as a periodic structure.

The semiconductor substrate 12 has not the collector layer 14 but an N$^+$ type cathode layer 48 in the surface layer of the second surface 12*b* side in the diode cell 46*a*. The semiconductor substrate 12 partially has P$^+$ type anode regions 50 in the surface layer of the base layer 20. In the diode cell 46*a*, no emitter regions 28 are formed on sides of the first gate electrodes 26*a* and the second gate electrodes 26*b*. Reference numeral 52 denotes insulating films that electrically isolate the gate electrodes 26 from the first pad 32. A diode formed in the diode cell 46*a* is connected in anti-parallel to IGBTs formed in the transistor cells 44, and functions as a diode for reflux. As described above, in this embodiment, the semiconductor substrate 12 is formed with a reverse conducting insulated gate bipolar transistor (RCIGBT).

Therefore, in the semiconductor element 10*d* configured as described above, when the drive signal is selectively input to the first gate pad 36*a* in a state where a predetermined voltage is applied between the first pad 32 and the second pad 40, the channels are formed on both sides of the first transistor cell 44*a* in the first direction. Therefore, a current flows in the first transistor cell 44*a* as indicated by solid arrows in FIG. 7. In this situation, unlike the first embodiment, no current flows in the diode cell 46*a*. The first transistor cell 44*a* can be inspected through this first inspection process.

On the other hand, when the drive signal is selectively input to the second gate pad 36*b* in a state where a predetermined voltage is applied between the first pad 32 and the second pad 40, the channels are formed on both sides of the second transistor cell 44*b* in the first direction. Therefore, a current flows in the second transistor cell 44*b* as indicated by dashed arrows in FIG. 7. In this situation, unlike the first embodiment, no current flows in the diode cell 46*a*. The second transistor cell 44*b* can be inspected through this second inspection process. For convenience, FIG. 7 illustrates the current (sold arrows) that flows in the first inspection process, and the current (dashed arrows) that flows in the second inspection process together.

As a result, in each of the first transistor cell 44*a* and the second transistor cell 44*b*, the high current density can be ensured even with the current smaller than that in the conventional art. In the case of obtaining the comparable current density, since the current may be smaller than that in the conventional art, the local current concentration can be suppressed.

In this embodiment, the cell 42 defined by the first gate electrode 26*a* and the second gate electrode 26*b* forms the diode cell 46*a* as the separation cell 46. Therefore, in the first inspection process, even if the drive signal is supplied to the first gate electrodes 26*a*, no channel is formed on the first gate electrode 26*a* side. In the second inspection process, even if the drive signal is supplied to the second gate electrodes 26*b*, no channel is formed on the second gate electrode 26*b* side. Therefore, in the cells 42 defined by the first gate electrodes 26*a* and the second gate electrodes 26*b*, no current flows through each side. Therefore, all of the transistor cells 44 can be inspected in a state where the channels are formed on both of the sides at the same time. In addition, the same current can be supplied to all of the first transistor cell 44*a* and the second transistor cell 44*b*.

(Second Modification)

Figure 8:
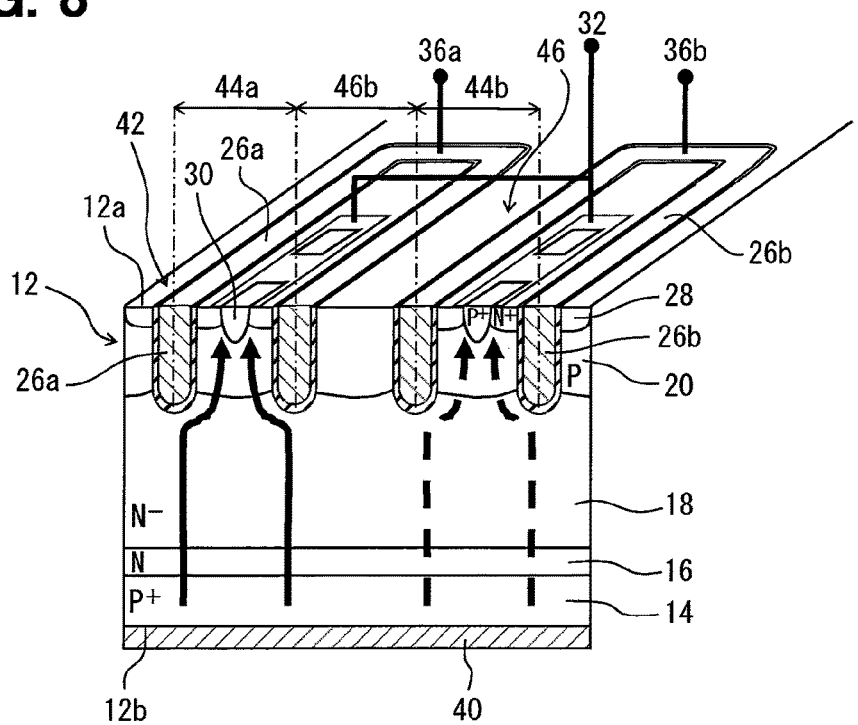
FIG. 8 is a perspective cross-sectional view of a semiconductor element according to a second modification.

In the second embodiment, the separation cell 46 is exemplified by the diode cell 46*a*. However, the separation cell 46 may be configured by the cell 42 that does not function as the transistor, in other words, any cell 42 into which no current flows even if the drive signal is supplied to the gate pads 36. For example, as illustrated in FIG. 8, the separation cell 46 can be configured by a floating cell 46b that is in an electrically floating state and is not electrically connected to the first pad 32. In this case, the same advantages as those described in the above embodiment can be obtained.

For convenience, FIG. 8 illustrates the current (sold arrows) that flows in the first inspection process, and the current (dashed arrows) that flows in the second inspection process together.

Third Embodiment

In this embodiment, parts common to those in the above embodiments will be omitted from the description.

Figure 9:
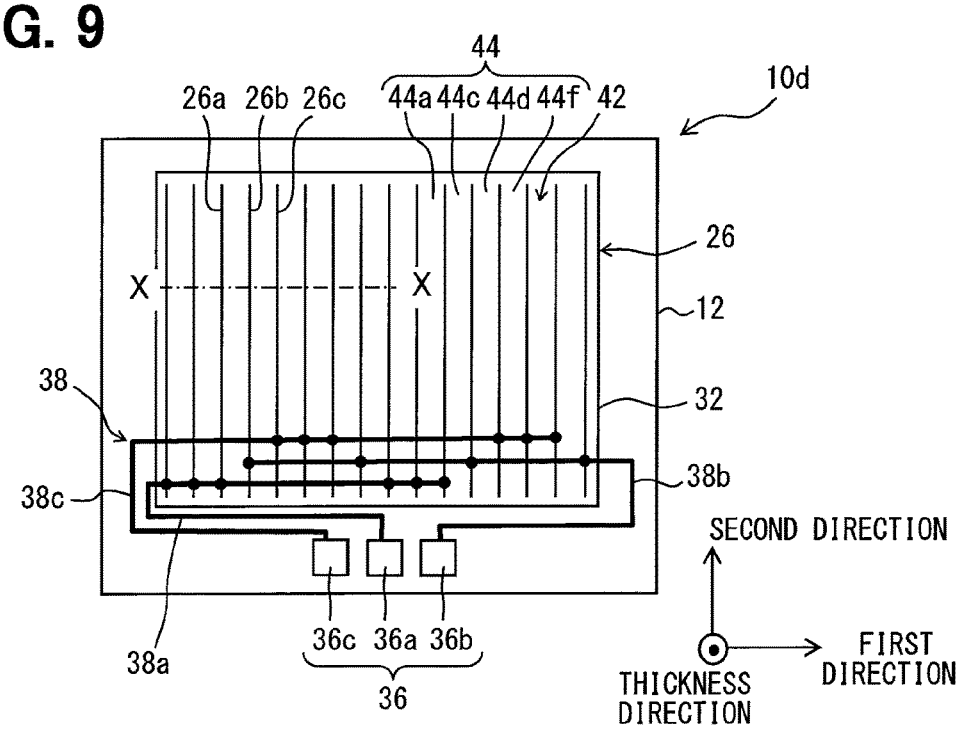
FIG. 9 is a plan view illustrating a semiconductor element according to a third embodiment.
Figure 10:
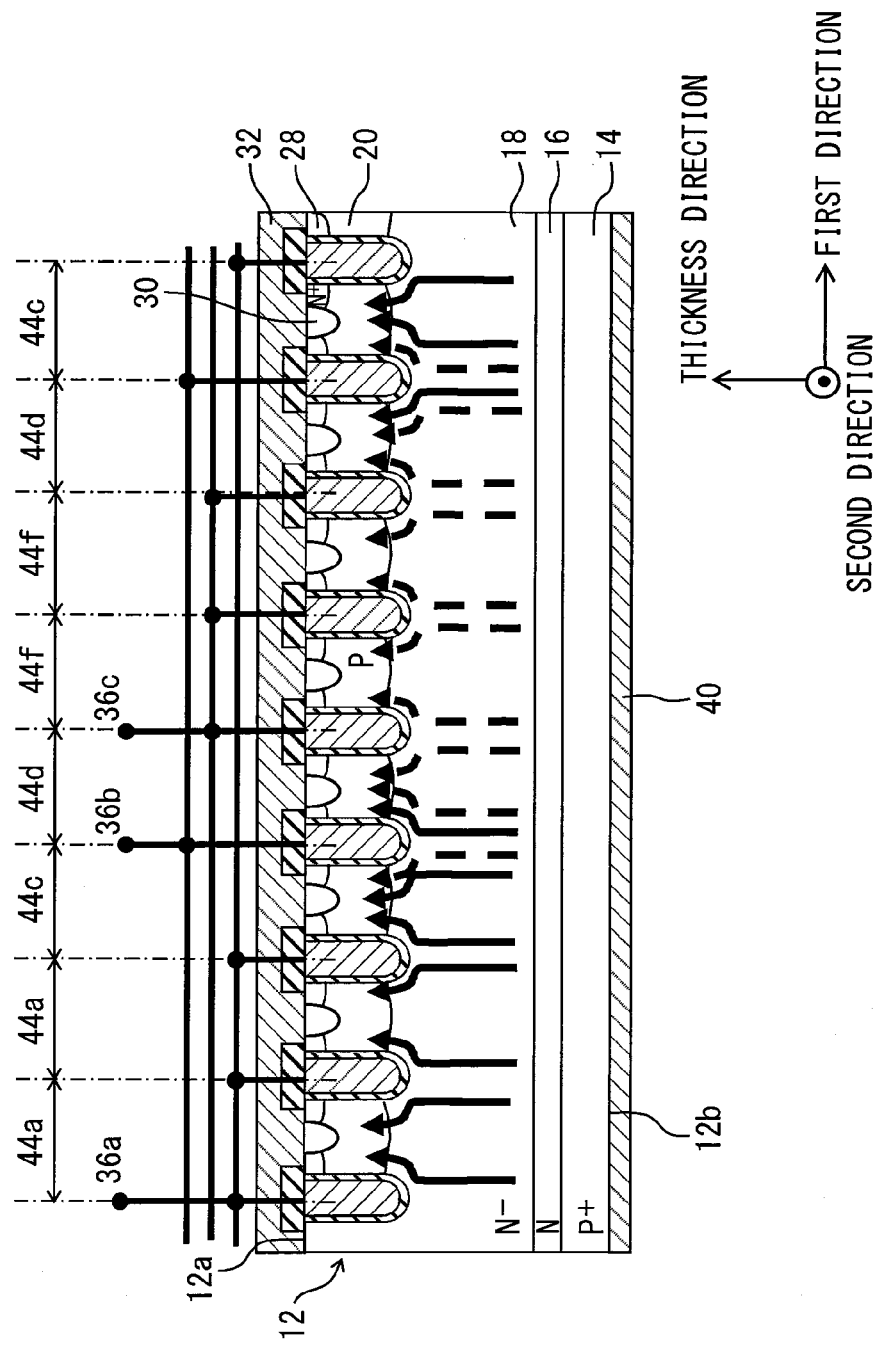
FIG. 10 is a cross-sectional view of the semiconductor element taken along a line X-X in FIG. 9.

In this embodiment, as illustrated in FIGS. 9 and 10, the gate pads 36 include a third gate pad 36c in addition to the first gate pad 36a and the second gate pad 36b. The gate wirings 38 include a third gate wiring 38c connected to the third gate pad 36c in addition to the first gate wiring 38a and the second gate wiring 38b. The gate electrodes 26 include a third gate electrode 26c electrically connected to the third gate pad 36c in addition to the first gate electrodes 26a and the second gate electrodes 26b.

Each gate electrode 26 of the different type which is located adjacent to the first gate electrode 26a is configured by the second gate electrode 26b in the first direction. On the other hand, each gate electrode 26 of the different type which is located adjacent to the third gate electrode 26c is configured by the second gate electrode 26b. In other words, the first gate electrode 26a is not adjacent to the third gate electrode 26c.

The transistor cells 44 include the third transistor cell 44c defined by the first gate electrode 26a and the second gate electrode 26b which are adjacent to each other, and a fourth transistor cell 44d defined by the second gate electrode 26b and the third gate electrode 26c which are adjacent to each other. The other configurations are identical with those in the first embodiment.

In the example illustrated in FIGS. 9 and 10, the transistor cells 44 include the first transistor cell 44a, and a sixth transistor cell 44f defined by a pair of third gate electrodes 26c adjacent to each other, in addition to the third transistor cell 44c and the fourth transistor cell 44d. The respective transistor cells 44a, 44c, 44d, and 44f are periodically arranged so that the number of respective transistor cells 44a, 44c, 44d, and 44f becomes equal to each other. In detail, two first transistor cells 44a, one third transistor cell 44c, one fourth transistor cell 44d, two sixth transistor cells 44f, one fourth transistor cell 44d, and one third transistor cell 44c are arranged in the stated order in the first direction to configure one set. In other words, three first gate electrodes 26a, one second gate electrode 26b, three third gate electrodes 26c, and one second gate electrode 26b configure one set in the first direction.

When the drive signal is selectively input to the first gate pad 36a and the second gate pad 36b in a state where the predetermined voltage is applied between the first pad 32 and the second pad 40, channels are formed in the vicinity of the first gate electrode 26a and the second gate electrode 26b. Specifically, as illustrated in FIG. 10, the channels are formed on both sides of the first transistor cell 44a, both sides of the third transistor cell 44c, and the second gate electrode 26b side of the fourth transistor cell 44d in the first direction. Therefore, a current flows as indicated by solid arrows in FIG. 10. The first transistor cell 44a, the third transistor cell 44c, and half of the fourth transistor cell 44d can be inspected through this first inspection process.

On the other hand, when the drive signal is selectively input to the second gate pad 36a and the third gate pad 36c in a state where the predetermined voltage is applied between the first pad 32 and the second pad 40, channels are formed in the vicinity of the second gate electrode 26b and the third gate electrode 26c. Specifically, as illustrated in FIG. 10, the channels are formed on both sides of the fourth transistor cell 44d, both sides of the sixth transistor cell 44f, and the second gate electrode 26b side of the third transistor cell 44c in the first direction. Therefore, a current flows as indicated by dashed arrows in FIG. 10. The fourth transistor cell 44d, the sixth transistor cell 44f, and half of the third transistor cell 44c can be inspected through this second inspection process. For convenience, FIG. 10 illustrates the current (sold arrows) that flows in the first inspection process, and the current (dashed arrows) that flows in the second inspection process together.

As described above, even in this embodiment, since the plural gate pads 36 are provided, and the inspection of both sides of the third transistor cell 44c and the fourth transistor cell 44d at the same time can be performed in the respective different processes, the high current density can be ensured even with a current smaller than that in the conventional art. In the case of obtaining the comparable current density, since the current may be smaller than that in the conventional art, the local current concentration can be suppressed.

Because all of the transistor cells 44 (44a, 44c, 44d, 44f) can be inspected through two inspections although three types of gate pads 36a, 36b, and 36c are provided, the inspection time can be reduced.

In addition, all of the third transistor cell 44c and the fourth transistor cell 44d which are defined by the gate electrodes 26 different from each other can be inspected in a state where the channels are formed on both sides thereof at the same time. Therefore, all of the transistor cells 44 including the first transistor cell 44a and the sixth transistor cell 44f which are defined by the same type of gate electrodes 26 can be inspected in a state where the channels are formed on both sides thereof at the same time.

Further, the same current can be supplied to all of the third transistor cell 44c and the fourth transistor cell 44d.

In this embodiment, the numbers of transistor cells 44 of all types are made equal to each other, but the combination of the numbers is not limited thereto. The transistor cell 44 defined by the same type of gate electrode 26 may include the second transistor cell 44b.

(Third Modification)

Figure 11:
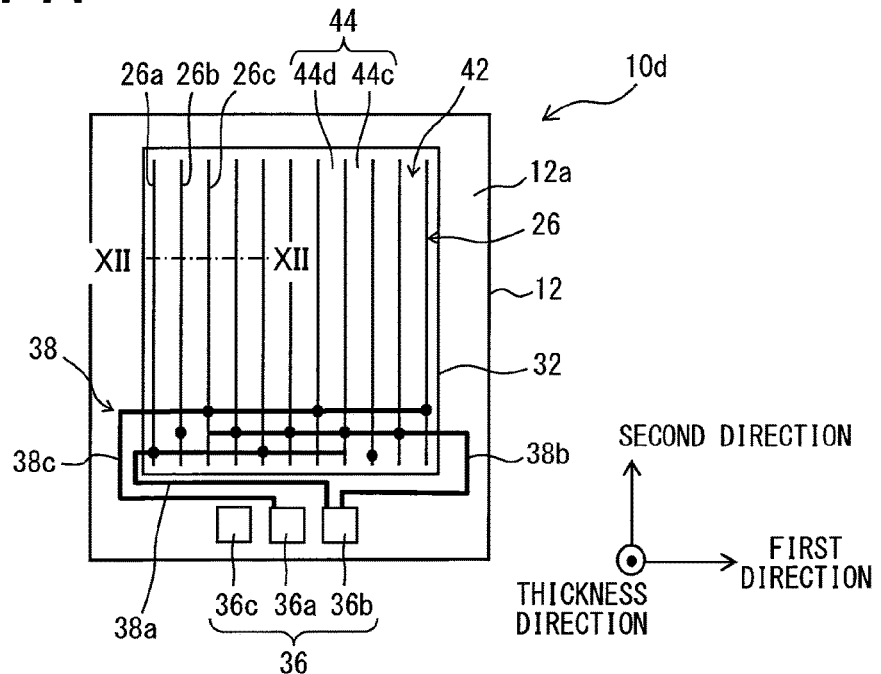
FIG. 11 is a plan view illustrating a semiconductor element according to a third modification.
Figure 12:
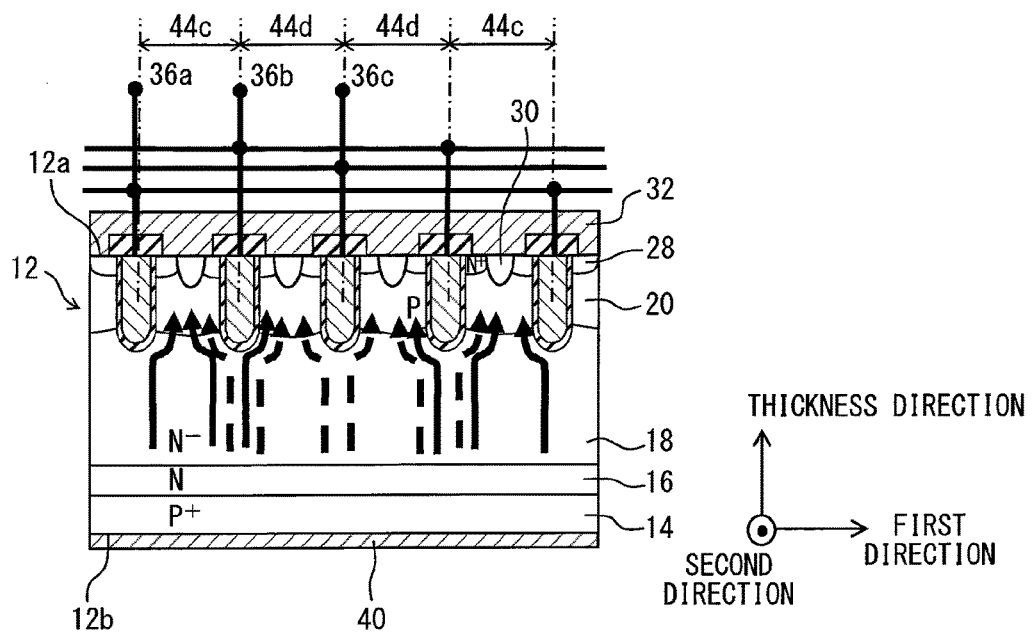
FIG. 12 is a cross-sectional view of the semiconductor element taken along a line XII-XII in FIG. 11.

In the third embodiment, the transistor cells 44 defined by the same type of gate electrodes 26, for example, the first transistor cell 44a and the sixth transistor cell 44f are included. However, as illustrated in FIGS. 11 and 12, only the third transistor cell 44c and the fourth transistor cell 44d may be included as the transistor cells 44. In the example illustrated in FIGS. 11 and 12, the respective transistor cells 44c and 44d are periodically arranged so that the number of respective transistor cells 44c and 44d becomes equal to each other. Specifically, one first gate electrode 26a, one second gate electrode 26b, one third gate electrode 26c, and one second gate electrode 26b configure one set in the first direction, and this configuration is periodically repeated. As a result, one third transistor cell 44c, one fourth transistor cell 44c, one fourth transistor cell 44d, and one third transistor cell 44c are arranged in the stated order in the first direction to configure one set.

When the drive signal is input to the first gate pad 36a and the second gate pad 36b in a state where a predetermined voltage is applied between the first pad 32 and the second pad 40, channels are formed on both sides of the third transistor cell 44c, and the second gate electrode 26b side of the fourth transistor cell 44d. Therefore, current flows as indicated by solid arrows in FIG. 12, and the third transistor cell 44c and half of the fourth transistor cell 44d can be inspected through this first inspection process.

On the other hand, when the drive signal is input to the second gate pad 36b and the third gate pad 36c in a state where a predetermined voltage is applied between the first pad 32 and the second pad 40, channels are formed on both sides of the fourth transistor cell 44d, and the second gate electrode 26b side of the third transistor cell 44c. Therefore, current flows as indicated by dashed arrows in FIG. 12, and the fourth transistor cell 44d and half of the third transistor cell 44c can be inspected through this second inspection process. For convenience, FIG. 12 also illustrates the current (sold arrows) that flows in the first inspection process, and the current (dashed arrows) that flows in the second inspection process together.

According to the above configuration, the same current can be supplied to all of the transistor cells 44.

Fourth Embodiment

In this embodiment, parts common to those in the above embodiments will be omitted from the description.

Figure 13:
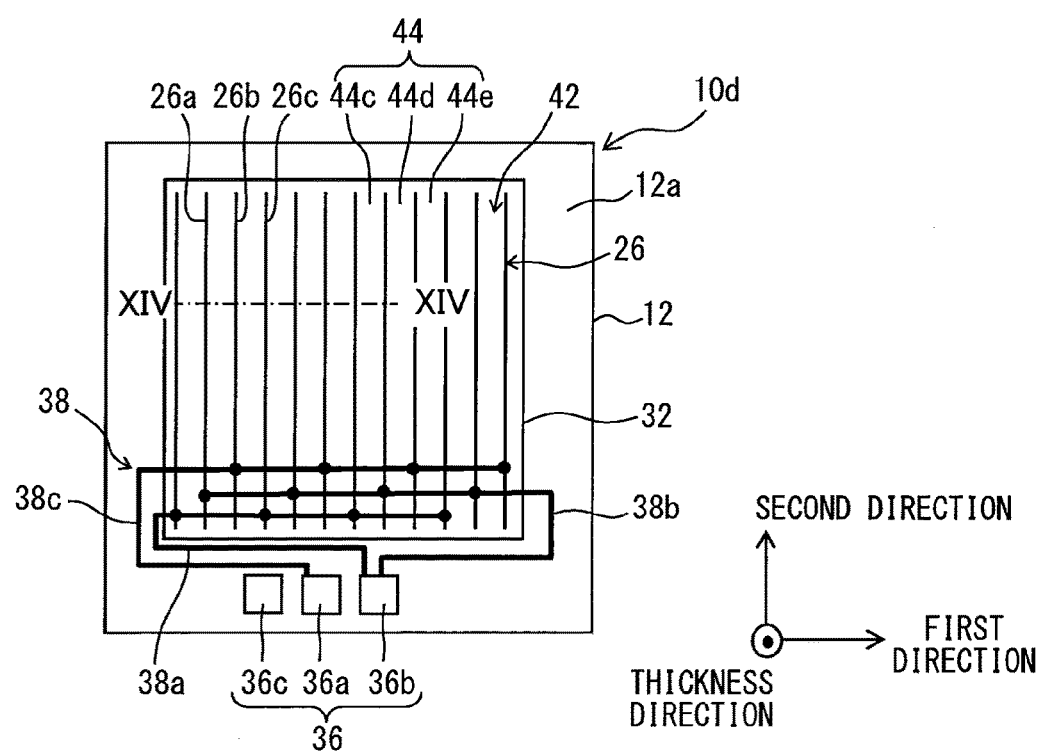
FIG. 13 is a plan view illustrating a semiconductor element according to a fourth embodiment.
Figure 14:
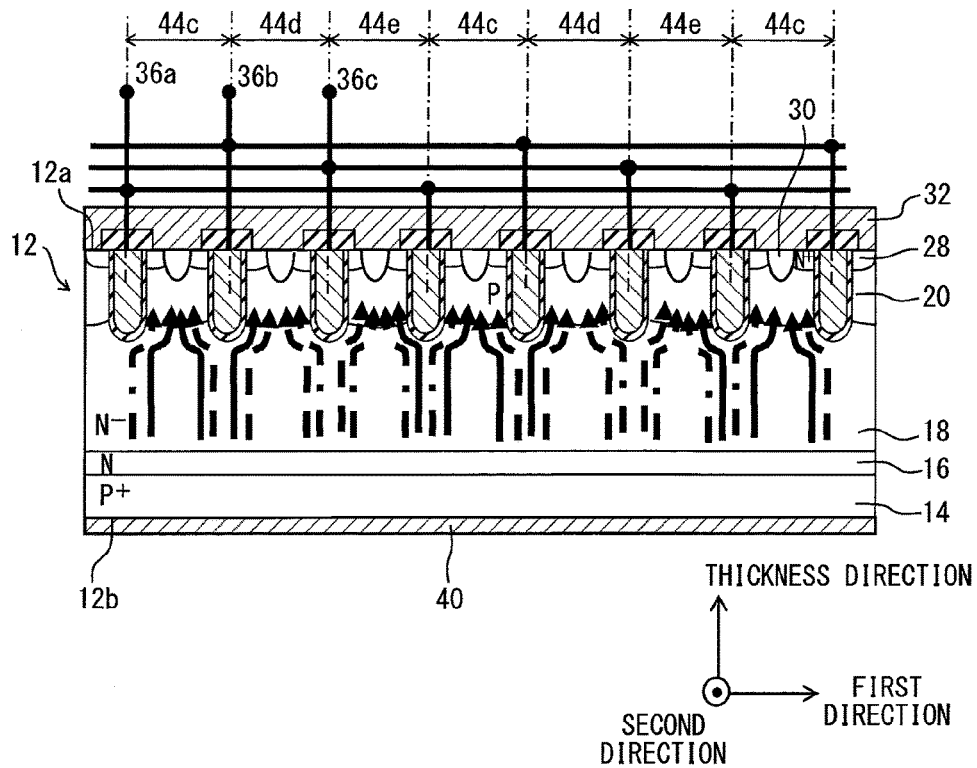
FIG. 14 is a cross-sectional view of the semiconductor element taken along a line XIV-XIV in FIG. 13.

In this embodiment, as with the third embodiment, three types of gate pads 36a, 36b, 36c, three types of gate wirings 38a, 38b, 38c, and three types of gate electrodes 26a, 26b, 26c are provided. As illustrated in FIGS. 13 and 14, the transistor cells 44 include a fifth transistor cell 44e defined by the third gate electrode 26c and the first gate electrode 26a which are adjacent to each other, in addition to the third transistor cell 44c and the fourth transistor cell 44d. In other words, the transistor cells 44 include only the third transistor cell 44c, the fourth transistor cell 44d, and the fifth transistor cell 44e. The other configurations are identical with those in the first embodiment.

In detail, the respective transistor cells 44c, 44d, and 44e are periodically arranged so that the number of respective transistor cells 44c, 44d, and 44e becomes equal to each other. One first gate electrode 26a, one second gate electrode 26b, and one third gate electrode 26c are arranged in the stated order to configure one set in the first direction, and this configuration is periodically repeated. As a result, one third transistor cell 44c, one fourth transistor cell 44c, and one fifth transistor cell 44e are arranged in the stated order in the first direction to configure one set.

The drive signal is input to the first gate pad 36a and the second gate pad 36b in a state where the predetermined voltage is applied between the first pad 32 and the second pad 40. Then, the channels are formed on both sides of the third transistor cell 44c, the second gate electrode 26b side of the fourth transistor cell 44d, and the first gate electrode 26a side of the fifth transistor cell 44e. Therefore, a current flows as indicated by solid arrows in FIG. 14. The third transistor cell 44c, half of the fourth transistor cell 44d, and half of the fifth transistor cell 44e can be inspected through this first inspection process.

The drive signal is input to the second gate pad 36b and the third gate pad 36c in a state where the predetermined voltage is applied between the first pad 32 and the second pad 40. Then, the channels are formed on both sides of the fourth transistor cell 44d, the second gate electrode 26b side of the third transistor cell 44c, and the third gate electrode 26c side of the fifth transistor cell 44e. Therefore, a current flows as indicated by dashed arrows in FIG. 14. The fourth transistor cell 44d, half of the third transistor cell 44c, and half of the fifth transistor cell 44e can be inspected through this second inspection process.

Further, the drive signal is input to the third gate pad 36c and the first gate pad 36a in a state where the predetermined voltage is applied between the first pad 32 and the second pad 40. Then, the channels are formed on both sides of the fifth transistor cell 44e, the first gate electrode 26a side of the third transistor cell 44c, and the third gate electrode 26c side of the fourth transistor cell 44d. Therefore, a current flows as indicated by alternate long and short dash arrows in FIG. 14. The fifth transistor cell 44e, half of the third transistor cell 44c, and half of the fourth transistor cell 44d can be inspected through this third inspection process. For convenience, FIG. 14 illustrates the current (sold arrows) that flows in the first inspection process, the current (dashed arrows) that flows in the second inspection process, and the current (alternate long and short dash arrows) that flows in the third inspection process together.

As a result, in each of the third transistor cell, the fourth transistor cell, and the fifth transistor cell, the high current density can be ensured even with the current smaller than that in the conventional art. In addition, all of the third transistor cell, the fourth transistor cell, and the fifth transistor cell which are defined by the different gate electrodes 26 can be inspected in a state where the channels are formed on both sides thereof at the same time. Furthermore, the same current can be supplied to all of the third transistor cell, the fourth transistor cell, and the fifth transistor cell.

As described above, even in this embodiment, the plural gate pads 36 are provided, and the inspection of both sides of the third transistor cell 44c, the fourth transistor cell 44d, and the fifth transistor cell 44e at the same time can be performed in the respective different processes. Therefore, the high current density can be ensured even with the current smaller than that in the conventional art. In the case of obtaining the comparable current density, since the current may be smaller than that in the conventional art, the local current concentration can be suppressed.

Also, all of the third transistor cell 44c, the fourth transistor cell 44d, and the fifth transistor cell 44e which are defined by the gate electrodes 26 different from each other can be inspected in a state where the channels are formed on both sides thereof at the same time. Therefore, all of the transistor cells 44 can be inspected in a state where the channels are formed on both of the sides at the same time.

Further, the same current can be supplied to all of the third transistor cell 44c, the fourth transistor cell 44d, and the fifth transistor cell 44e.

(Fourth Modification)

Figure 15:
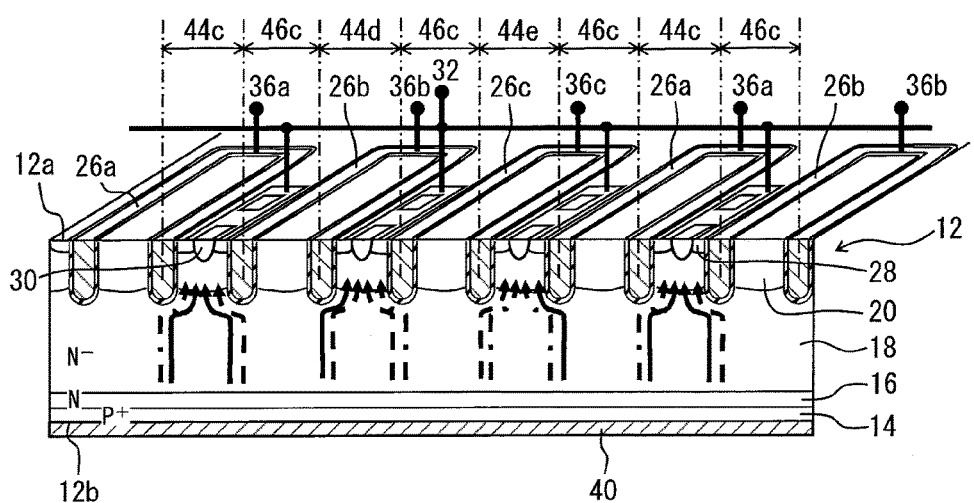
FIG. 15 is a perspective cross-sectional view illustrating a semiconductor element according to a fourth modification.

In the above embodiment, all of the cells 42 are configured by the transistor cells 44, and are also energized by the three gate pads 36a, 36b, and 36c three times to inspect both sides of all of the transistor cells 44 defined by the different gate electrodes 26 at the same time. However, as illustrated in FIG. 15, even with a configuration in which the transistor cells 44 and separation cells 46c are alternately arranged, energization is conducted by the three gate pads 36a, 36b, and 36c three times, and all of the transistor cells 44 defined by the different gate electrodes 26 can be inspected on both sides thereof at the same time. In FIG. 15, the separation cells 46c are configured by floating cells.

In FIG. 15, as with the first embodiment, each of the gate electrodes 26 is formed into an annular shape, and the first gate electrodes 26a, the second gate electrodes 26b, and the third gate electrodes 26c are periodically arranged in the stated order in the first direction. The cells 42 defined by the respective gate electrodes 26, in other words, the cells 42 within the annular gate electrodes 26 form the separation cells 46c. The transistor cells 44 include the third transistor cell 44c, the fourth transistor cell 44d, and the fifth transistor cell 44e. When attention is focused on the transistor cells 44, the third transistor cell 44c, the fourth transistor cell 44d, and the fifth transistor cell 44e are periodically arranged in the stated order in the first direction.

As with the fourth embodiment, the drive signal is input to the first gate pad 36a and the second gate pad 36b in a state where the predetermined voltage is applied between the first pad 32 and the second pad 40. Then, current flows as indicated by solid arrows in FIG. 15, and the third transistor cell 44c, half of the fourth transistor cell 44d, and half of the fifth transistor cell 44e can be inspected through this first inspection process.

The drive signal is input to the second gate pad 36b and the third gate pad 36c in a state where the predetermined voltage is applied between the first pad 32 and the second pad 40. Then, current flows as indicated by dashed arrows in FIG. 15, and the fourth transistor cell 44d, half of the third transistor cell 44c, and half of the fifth transistor cell 44e can be inspected through this second inspection process.

Further, the drive signal is input to the third gate pad 36c and the first gate pad 36a in a state where the predetermined voltage is applied between the first pad 32 and the second pad 40. Then, current flows as indicated by alternate long and short dash arrows in FIG. 15, and the fifth transistor cell 44e, half of the third transistor cell 44c, and half of the fourth transistor cell 44d can be inspected through this third inspection process. For convenience, FIG. 15 illustrates the current (sold arrows) that flows in the first inspection process, the current (dashed arrows) that flows in the second inspection process, and the current (alternate long and short dash arrows) that flows in the third inspection process together.

Fifth Embodiment

In this embodiment, parts common to those in the above embodiments will be omitted from the description.

The feature of this embodiment resides in that the plural gate pads 36 are short-circuited to each other after screening. The other configurations are identical with those in the first embodiment.

Figure 16:
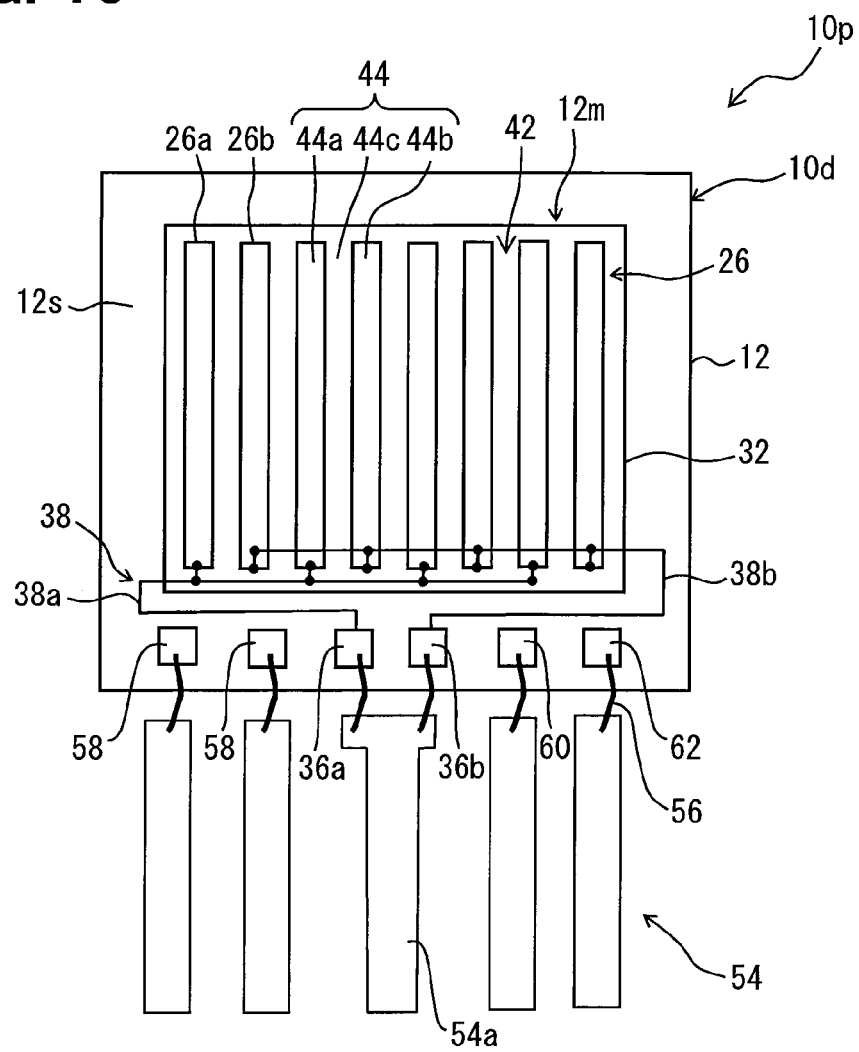
FIG. 16 is a plan view illustrating a semiconductor package according to a fifth embodiment.

As illustrated in FIG. 16, in this embodiment, the semiconductor element 10d illustrated in the first embodiment is connected with a terminal 54 (lead) for external connection to form a semiconductor package 10p. The semiconductor package 10p corresponds to a semiconductor device.

The terminals 54 are electrically connected to corresponding pads through bonding wires 56. The terminals 54 include at least a gate terminal 54a. In this embodiment, an end of the gate terminal 54a on the semiconductor substrate 12 side is T-shaped. One side of the T-shape is connected with the first gate pad 36a through the bonding wire 56, and the other side thereof is connected with the second gate pad 36b through the bonding wire 56.

In an example illustrated in FIG. 16, temperature sense pads 58, a current sense pad 60, and an emitter sense pad 62 are provided in addition to the gate pads 36, and those pads 58, 60, and 62 are also connected to the corresponding terminals 54 through the bonding wires 56.

In the semiconductor package 10p configured as described above, the semiconductor element 10d has the configuration illustrated in the first embodiment. For that reason, the above screening can be implemented on the semiconductor element 10d before the semiconductor package 10p is formed. In addition, since the gate pads 36a and 36b are connected to the common gate terminal 54a in a state of the semiconductor package 10p, the respective transistor cells 44 can operate commonly.

The same configuration can be applied to not only the semiconductor element 10d illustrated in the first embodiment, but also the semiconductor elements 10d illustrated in the other embodiments and modifications described above. In the above example, the semiconductor package 10p includes the semiconductor element 10d and the terminals 54. The semiconductor package 10p may further include a mold resin or a radiator plate.

(Fifth Modification)

Further, a semiconductor unit 10u may be configured with the inclusion of a plurality of the semiconductor packages 10p described above. In this case, the semiconductor unit 10u corresponds to the semiconductor device.

Figure 17:
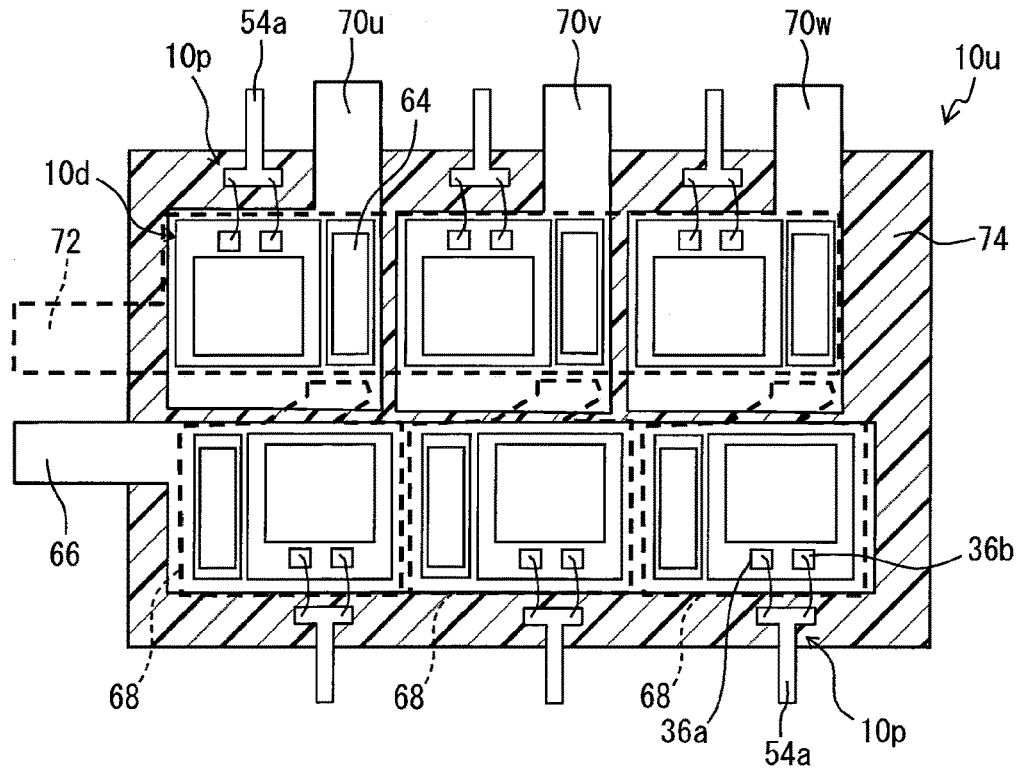
FIG. 17 is a diagram illustrating a semiconductor unit according to a fifth modification.
Figure 18:
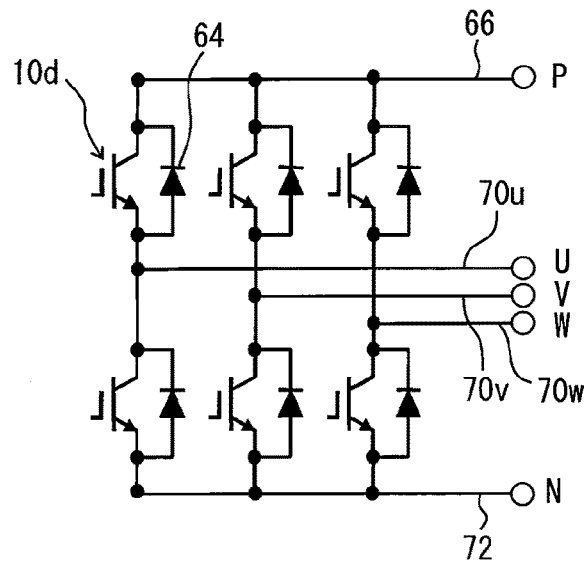
FIG. 18 is a diagram illustrating a circuit including the semiconductor unit illustrated in FIG. 17.

The semiconductor unit 10u illustrated in FIG. 17 has six semiconductor packages 10p (six semiconductor devices 10). The semiconductor unit 10u has six diode chips 64 each having a free wheel diode (FWD). As illustrated in FIG. 18, three-phase inverters are configured.

Three sets of semiconductor packages 10p and diode chips 64 on a highside side are arranged on a P-terminal 66 on a high potential side. The second pads 40 of the respective semiconductor elements 10d and anode electrodes of the respective diode chips 64 are electrically connected to the P-terminal 66. One relay member 68 is arranged for each set of semiconductor package 10p and diode chip 64. One end of the relay member 68 is electrically connected to the first pad 32 of the semiconductor element 10d and a cathode electrode of the diode chip 64.

On the other hand, three sets of semiconductor packages 10p and diode chips 64 on a lowside side are arranged on output terminals 70u, 70v, and 70w. The second pads 40 of the respective semiconductor elements 10d and anode electrodes of the respective diode chips 64 are electrically connected to the corresponding output terminals 70u, 70v, and 70w. The other ends of the above relay members 68 are electrically connected to the corresponding output terminals 70u, 70v, and 70w. An N-terminal 72 on a low potential side is so arranged as to cover the first pads 32 of all the semiconductor elements 10d and the cathode electrodes of all the diode chips 64 on the lowside side. The N-terminal 72 is electrically connected to the first pads 32 of the semiconductor elements 10d and the cathode electrodes of the diode chips 64 in three sets. Reference numeral 74 denotes a mold resin.

As described above, three upper and lower arms in which one set of semiconductor elements 10d (IGBT) is arranged in series between the P-terminal 66 and the N-terminal 72, and the diode chips 64 (FWD) are connected in anti-parallel to the respective semiconductor elements 10d are provided. Midpoints of the upper and lower arms are connected to the corresponding output terminals 70u, 70v, and 70w.

In the semiconductor unit 10u configured as described above, the semiconductor element 10d has, for example, the configuration illustrated in the first embodiment. For that reason, the above screening can be implemented on the semiconductor element 10d before the semiconductor package 10p is formed. Since the gate pads 36a and 36b are connected to the common gate terminal 54a, the respective transistor cells 44 can operate commonly. When the semiconductor element 10d is configured by an RCIGBT, the diode chip 64 is unnecessary.

Sixth Embodiment

In this embodiment, parts common to those in the above embodiments will be omitted from the description.

Figure 19:
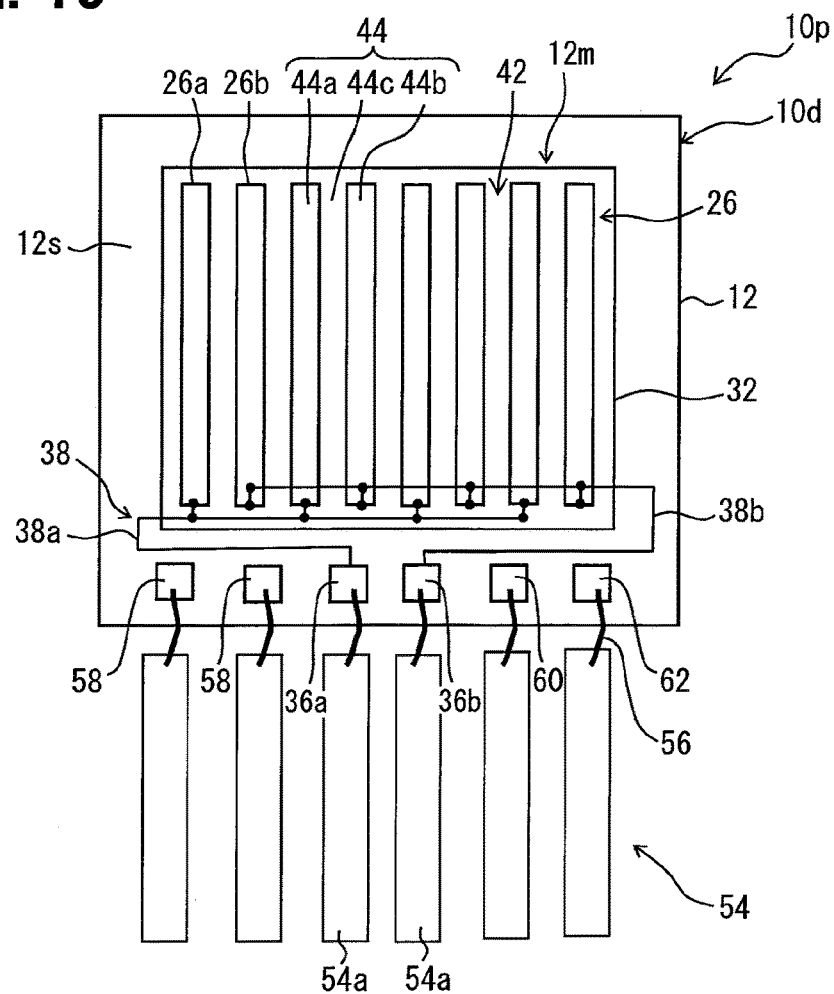
FIG. 19 is a plan view illustrating a semiconductor package according to a sixth embodiment.

As illustrated in FIG. 19, also, in this embodiment, the semiconductor element 10d illustrated in the first embodiment is connected with the terminal 54 to form the semiconductor package 10p. The semiconductor package 10p corresponds to a semiconductor device. A difference from the semiconductor package 10p according to the fifth embodiment resides in that the plural gate pads 36 are electrically separated from each other even after screening. That is, in the semiconductor package 10p, the first gate pad 36a and the second gate pad 36b are connected to the respective different gate terminals 54a. The other configurations are identical with those in the fifth embodiment.

In the semiconductor package 10p configured as described above, the semiconductor element 10d has the configuration illustrated in the first embodiment. For that reason, the above screening can be implemented on the semiconductor element 10d before the semiconductor package 10p is formed.

The gate pads 36a and 36b are connected to the gate terminals 54a different from each other even in a state of the semiconductor package 10p. Therefore, the high current density can be inspected even with a current smaller than that in the conventional art in the state of the semiconductor package 10p. Also, in the case of obtaining the comparable current density, since the current may be smaller than that in the conventional art, the local current concentration can be suppressed.

The same configuration can be applied to not only the semiconductor element 10d illustrated in the first embodiment, but also the semiconductor elements 10d illustrated in the other embodiments and modifications described above. In the above example, the semiconductor package 10p includes the semiconductor element 10d and the terminals 54. The semiconductor package 10p may further include a mold resin or a radiator plate.

As described in the fifth modification, the semiconductor unit 10u can be formed with the use of the semiconductor package 10p illustrated in this embodiment. In this case, the gate pads 36a and 36b are connected to the gate terminals 54a different from each other even in a state of the semiconductor unit 10. Therefore, the identical drive signal is input to the first gate pad 36a and the second gate pad 36b through the different gate terminals 54a, and the respective transistor cells 44 can operate commonly. For example, the operation of the first transistor cell 44a and the second transistor cell 44b can be shifted from each other with the different drive signals at arbitrary timing.

(Sixth Modification)

A sixth modification is a modification in which the plural gate pads 36 are connected to the gate terminals 54a different from each other.

Figure 20:
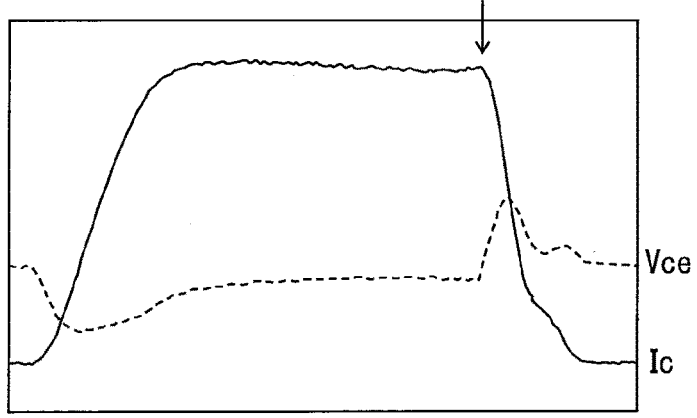
FIG. 20 is a diagram illustrating a turn-off signal waveform at the time of short-circuiting in a semiconductor unit of the prior art.

For example, in the conventional semiconductor unit that has only one gate pad 36, and turns on all of the transistor cells 44 at the same time, when one of the upper and lower arms in which the semiconductor elements 10d are connected in series is short-circuited, a collector current Ic and a collector-emitter voltage Vce are represented at the time of turn-off as illustrated in FIG. 20. When an off signal is input as the drive signal, the collector current Ic rapidly decreases, and the voltage Vce jumps sharply. That is, a large off-serge voltage is generated. In FIG. 20, the collector current Ic is indicated by a solid line, and the voltage Vce is indicated by a dashed line.

Figure 21:
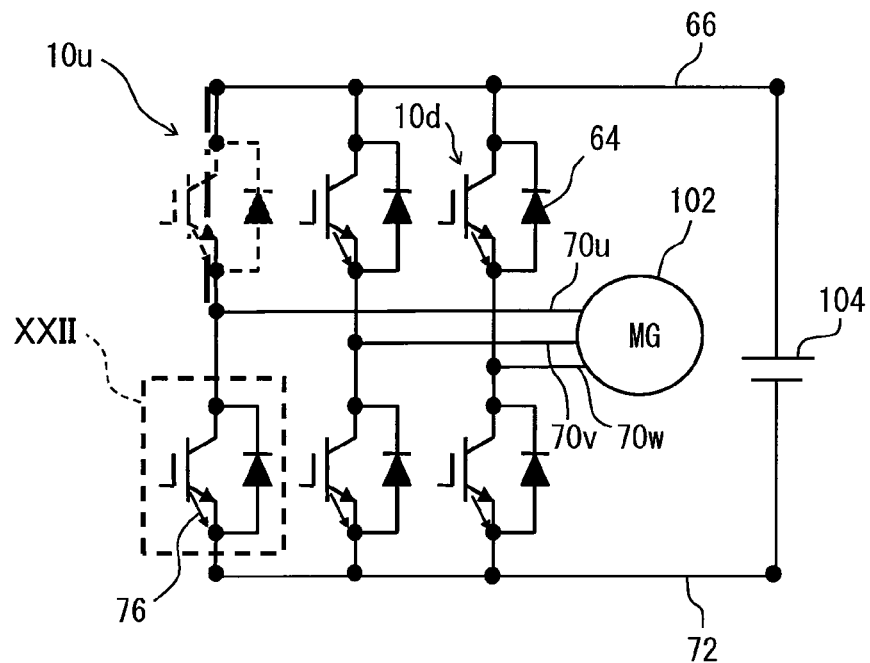
FIG. 21 is a diagram illustrating a circuit configuration of a semiconductor unit according to a sixth modification.

In this case, a case in which the semiconductor unit 10u (inverter circuit) illustrated in FIG. 21 is configured by the semiconductor element 10d illustrated in, for example, the fourth modification (refer to FIG. 15), and the upper arm side of the upper and lower arms of U-phase is short-circuited is assumed. In the inverter circuit, the semiconductor element 10d configuring each of the arms has a known current sense 76 in a sense region provided in a part of the outer peripheral region 12s. The current sense 76 has the same structure as that of the transistor cells 44, and an area of the sense region is, for example, one several thousandths of an area of the main region 12m. A current that flows in the current sense 76 flows in a sense resistor not shown to detect a generated voltage, and to detect whether short-circuit is present, or not. In FIG. 21, reference numeral 102 denotes a motor generator, and reference numeral 104 denotes a power supply.

Figure 22:
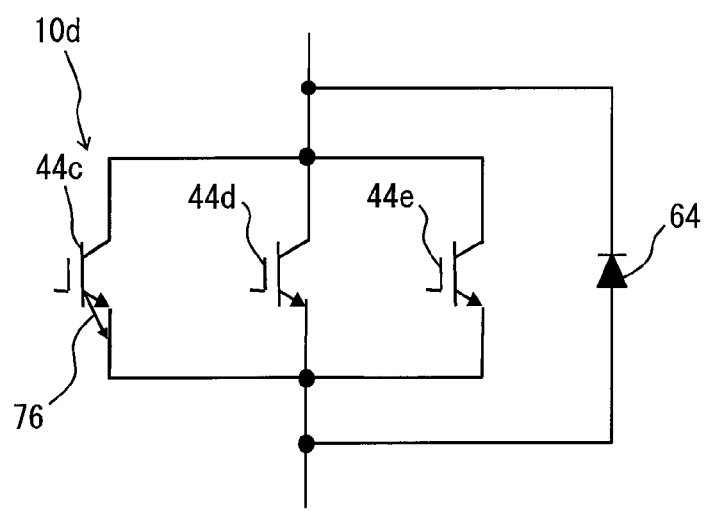
FIG. 22 is an enlarged view of a region XXII in FIG. 21.

As illustrated in FIG. 22, the semiconductor element 10d has three types of transistor cells 44c, 44d, and 44e. As illustrated in the fourth modification, the third transistor cell 44c is mainly controlled according to drive signals input to the first gate pad 36a and the second gate pad 36b. The fourth transistor cell 44d is mainly controlled according to drive signals input to the second gate pad 36b and the third gate pad 36c. The fifth transistor cell 44e is mainly controlled according to drive signals input to the third gate pad 36c and the first gate pad 36a. Further, the respective gate pads 36a, 36b, and 36c are connected to the gate terminals 54a different from each other. In FIG. 22, the current sense 76 is formed in correspondence with the third transistor cell 44c.

Figure 23:
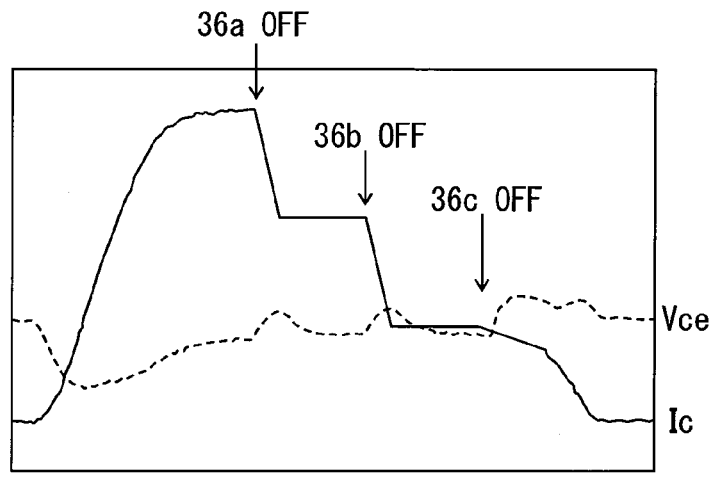
FIG. 23 is a diagram illustrating a turn-off signal waveform at the time of short-circuiting in a semiconductor unit according to the sixth modification.

A gate driver not shown inputs an off signal to the three gate pads 36a, 36b, and 36c step by step (with time shift), as illustrated in FIG. 23, only when the short-circuit is detected on the basis of the voltage across the sense resistor described above. As a result, the jump of the voltage Vce can be reduced, and a short-circuit energy can be suppressed. Accordingly, both of the upper and lower arms can be prevented from being short-circuited. In a time except for the short-circuit time, the respective transistor cells 44 operate commonly. Also, in FIG. 23, the collector current Ic is indicated by a solid line, and the voltage Vce is indicated by a dashed line.

In the above example, the current sense 76 and the sense resistor are provided, but a shunt resistor may be used. Also, the above configuration can be applied to the semiconductor elements 10d illustrated in the modifications except for the fourth modification, and the respective embodiments.

(Seventh Modification)

In a seventh modification, the plural gate pads 36 are connected to the respective gate terminals 54a different from each other.

In the sixth modification, the gate control at the time of turn-off in the configuration where the plural gate pads 36 are electrically separated from each other in the state of the semiconductor unit 10u is described. In this modification, at the time of turn-off, the gate driver inputs an on-signal as the drive signal to only a part of the plural gate pads 36, to thereby detect whether the short-circuit is present, or not. The gate driver also inputs the on-signal to the remaining gate pads 36 only when it is confirmed that the short-circuit does not occur.

Figure 24:
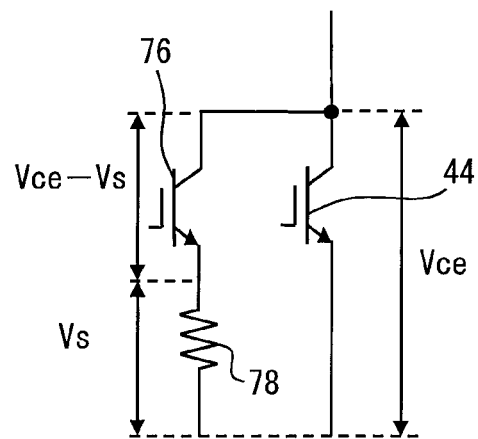
FIG. 24 is a diagram illustrating a relationship between a transistor cell and a current sense in a semiconductor unit according to a seventh modification.

In this case, a case in which the semiconductor unit 10u (inverter circuit) is configured by the semiconductor element 10d illustrated in, for example, the second modification (refer to FIG. 8) is assumed. The semiconductor element 10d of each arm has the first transistor cell 44a and the second transistor cell 44b. Each of the semiconductor elements 10d has the current sense 76. As illustrated in FIG. 24, the current sense 76 is connected in series with the sense resistor 78.

The gate driver first inputs the on-signal to only the first gate pad 36a at the time of turn-off. As a result, the first transistor cell 44a and the IGBT of the current sense 76 turn on. In this case, the current Ic, the voltage Vce, and a gate voltage Vg change as represented by waveforms illustrated in FIG. 25. The gate driver determines whether the short-circuit occurs, or not, on the basis of a voltage Vs between both ends of the sense resistor 78. When the short-circuit does not occur, the gate driver also inputs the on-signal to the second gate pad 36b. As a result, the second transistor cell 44b, that is, all of the transistor cells 44 turn on. As represented by the waveforms illustrated in FIG. 25, the current Ic, the voltage Vce, and the gate voltage Vg change.

As described above, because the transistor cells 44 turn on step by step, as compared with a case in which all of the transistor cells 44 turn on at the same time, the amount of electric charge for charging the gate electrodes 26 at one time can be reduced. As a result, the power supply of the first gate electrodes 26a can be reduced. Also, because turn-on can be performed in a state where the gate capacitance is small, a time required for turn-on is shortened, and the turn-on loss can be reduced.

Also, when it is determined on the basis of the voltage Vs between both ends of the sense resistor 78 that short-circuit occurs, the second gate electrode 26 connected to the second gate pad 36b can be blocked from the off-state. Therefore, off-surge and the supplied energy can be suppressed.

Figure 25:
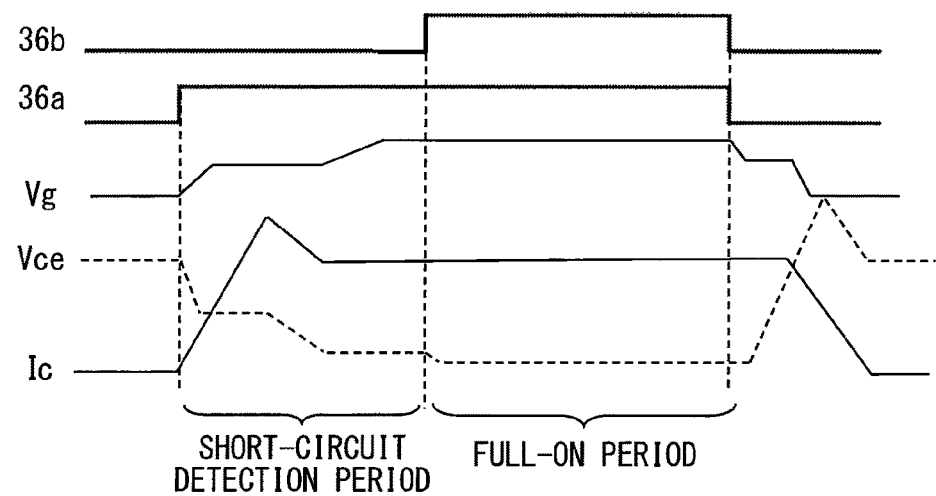
FIG. 25 is a diagram illustrating a signal waveform at the time of turn-off in a semiconductor unit according to the seventh modification.

Incidentally, as illustrated in FIG. 24, the voltage Vs between both ends of the sense resistor 78 is determined according to a shunt current to the current sense 76, and the sense resistor 78, and also does not reach the voltage Vce of the transistor cells 44 connected in parallel to each other, or higher. Therefore, when the voltage Vce is too low at timing to be detected, even if a large amount of current flows in the transistor cells 44 of the main region 12m, the voltage Vs between both ends thereof does not increase, resulting in a possibility that the short-circuit cannot be detected. On the contrary, according to the above configuration, the current sense 76 is controlled according to only the first gate pad 36a to which the on-signal is input previously. For that reason, as illustrated in FIG. 25, the voltage Vs between both ends thereof can be detected in a state where the voltage Vce is higher than that in a state where all of the transistor cells 44 are on. Therefore, it can be detected whether the short-circuit is present, or not, with high precision.

The above configuration can also be applied to the semiconductor elements 10d illustrated in the modifications except for the second modification, and the respective embodiments.

(Eighth Modification)

In an eighth modification, the plural gate pads 36 are connected to the respective gate terminals 54a different from each other.

Figure 26:
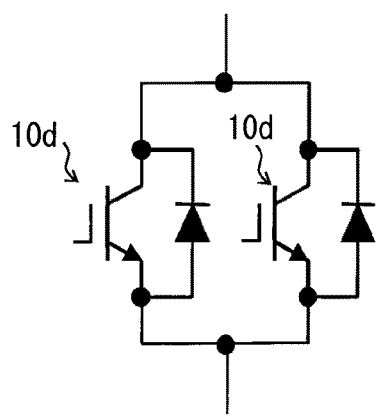
FIG. 26 is a diagram illustrating a circuit configuration of a semiconductor package according to an eighth modification.

In this example, as illustrated in FIG. 26, the plural semiconductor elements 10d are connected in parallel to each other to configure one arm (for example, arm on the low side configuring a U-phase).

Figure 27:
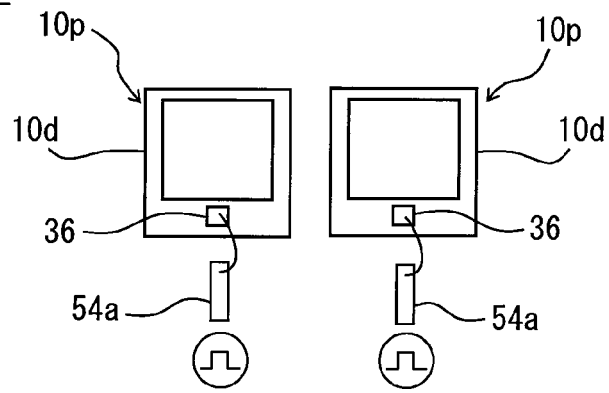
FIG. 27 is a diagram illustrating a connection structure between a semiconductor element and a gate terminal in the conventional art.

In the conventional semiconductor element 10d that has only one gate pad 36, and turns on all of the transistor cells 44 at the same time, for example, as illustrated in FIG. 27, there arises a problem when controlling the plural semiconductor elements 10d configuring one arm by plural control ICs. FIG. 27 illustrates an example in which the two semiconductor elements 10d are controlled by the two control ICs. The operation of the IGBT is varied between the two semiconductor elements 10d connected in parallel to each other due to a characteristic difference of the control IC.

Figure 28:
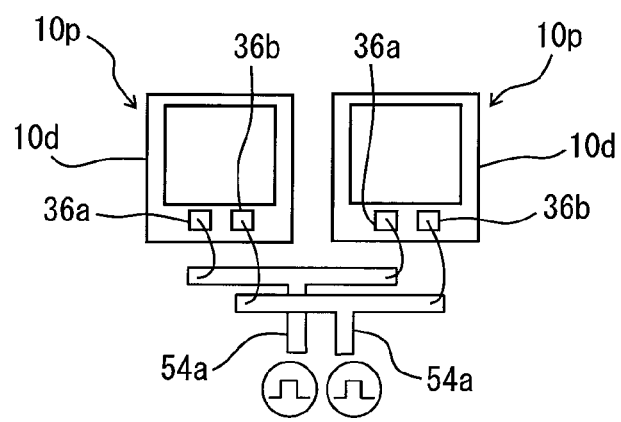
FIG. 28 is a diagram illustrating a connection structure between a semiconductor element and a gate terminal in a semiconductor package according to the eighth modification.

On the contrary, in this modification, as illustrated in FIG. 28, in two semiconductor elements 10d, the respective gate pads 36a and 36b are connected to the gate terminals 54a different from each other. Also, one of the two gate terminals 54a is connected with the first gate pad 36a of each semiconductor element 10d, and the other of the gate terminals 54a is connected with the second gate pad 36b of each semiconductor element 10d. Therefore, even if the characteristic difference is present between the two control ICs, an influence of the characteristic difference is substantially equal to each other between the two semiconductor elements 10d connected in parallel to each other. Thus, variations that occur in the operation of the IGBT can be suppressed.

Incidentally, the above configuration can also be applied to the semiconductor element 10d having three or more gate pads 36.

The preferred embodiments of the present disclosure have been described above. However, the present disclosure is not limited to the embodiments and the modifications described above, and various modifications can be implemented without departing from the spirit of the present disclosure.

The element formed on the semiconductor substrate 12 is exemplified by the IGBT. However, a transistor having the gate electrode 26 other than the IGBT, for example, a MOFFET can be employed as the element.

The IGBT of the trench gate structure is exemplified. However, the structure of the gate electrodes 26 is not limited to the above example, but can also be applied to the IGBT of a planar structure.

The N-channel type IGBT is exemplified, but it is needless to say that the IGBT can also be applied to a P-channel type IGBT.

The plural types of transistor cells 44 are periodically arranged in the first direction. However, the arrangement may not be periodical.

The example in which the second pad 40 is formed on the second surface 12b of the semiconductor substrate 12, that is, the example of the vertical IGBT is illustrated. However, the second pad 40 may be formed on the same first surface 12a as that of the first pad 32. That is, a horizontal IGBT or MOSFET can also be employed.

The invention claimed is:

1. A semiconductor device, comprising:
a semiconductor substrate having a first surface and a second surface that is located opposite to the first surface in a thickness direction, and including a plurality of gate electrodes that is juxtaposed in a first direction orthogonal to the thickness direction, the adjacent gate electrodes defining a plurality of cells, and the plurality of cells including a plurality of transistor cells;
a plurality of gate wirings formed on the first surface of the semiconductor substrate and electrically connected to the plurality of gate electrodes;
a plurality of gate pads formed on the first surface of the semiconductor substrate and electrically connected to the plurality of gate electrodes through the plurality of gate wirings;

a first pad formed on the first surface of the semiconductor substrate and common to the plurality of transistor cells; and a second pad formed on one of the first surface and the second surface of the semiconductor substrate and common to the plurality of transistor cells, wherein the plurality of gate wirings electrically partitioned from each other is connected to the respective gate pads, the plurality of gate electrodes is electrically partitioned into a plurality of types according to the plurality of gate wirings, the plurality of transistor cells is partitioned into a plurality of types by a combination of the defined gate electrodes, and the plurality of types of the transistor cells is periodically and repeatedly arranged in the first direction.

2. The semiconductor device according to claim 1, wherein the plurality of gate pads includes a first gate pad and a second gate pad, the plurality of gate electrodes includes first gate electrodes that are electrically connected to the first gate pads, and second gate electrodes that are electrically connected to the second gate pads, the plurality of transistor cells includes a first transistor cell that s defined by a pair of the first gate electrodes, and a second transistor cell that is defined by a pair of the second gate electrodes, and the plurality of cells includes a separation cell that is defined by the first gate electrode and the second gate electrode which are adjacent to each other, and does not function as a transistor.

3. The semiconductor device according to claim 2, wherein the separation cell forms a diode cell that is electrically connected to the first pad and the second pad.

4. The semiconductor device according to claim 2, wherein the separation cell forms a cell that is in a floating state and is not electrically connected to the first pad.

5. The semiconductor device according to claim 2, wherein a drive signal is selectively input to the first gate pad in a state where a predetermined voltage is applied between the first pad and the second pad to investigate the first transistor cell, and after an inspection of the first transistor cell has been completed, the drive signal is selectively input to the second gate pad in a state where a predetermined voltage is applied between the first pad and the second pad to investigate the second transistor cell.

6. The semiconductor device according to claim 1, wherein the plurality of gate pads includes a first gate pad, a second gate pad, and a third gate pad, the plurality of gate electrodes includes a first gate electrode that is electrically connected to the first gate pad, a second gate electrode that is electrically connected to the second gate pad, and a third gate electrode that is electrically connected to a third gate pad, in the first direction, the second gate electrode is arranged adjacent to the first gate electrode, and the second gate electrode is arranged adjacent to the third gate electrode, and the plurality of transistor cells includes a third transistor cell that is defined icy the first gate electrode and the second gate electrode which are adjacent to each other, and a fourth transistor cell that is defined by the second gate electrode and the third gate electrode which are adjacent to each other.

7. The semiconductor device according to claim 6, wherein a drive signal is selectively input to the first gate pad and the second gate pad in a state where a predetermined voltage is applied between the first pad and the second pad to investigate the third transistor cell, and after an inspection of the third transistor cell has been completed, the drive signal is selectively input to the second gate pad and the third gate pad in a state where a predetermined voltage is applied between the first pad and the second pad to investigate the fourth transistor cell.

8. The semiconductor device according to claim 1, wherein the plurality of gate pads includes a first gate pad, a second gate pad, and a third gate pad, the plurality of gate electrodes includes a first gate electrode that is electrically connected to the first gate pad, a second gate electrode that is electrically connected to the second gate pad, and a third gate electrode that is electrically connected to the third gate pad, and the plurality of transistor cells includes a third transistor cell that is defined by the first gate electrode and the second gate electrode which are adjacent to each other, a fourth transistor cell that is defined by the second gate electrode and the third gate electrode which are adjacent to each other, and a fifth transistor cell that is defined by the third gate electrode and the first gate electrode which are adjacent to each other.

9. The semiconductor device according to claim 8, wherein a drive signal is selectively input to the first gate pad and the second gate pad in a state where a predetermined voltage is applied between the first pad and the second pad to investigate the third transistor cell, after an inspection of the third transistor cell has been completed, the drive signal is selectively input to the second gate pad and the third gate pad in a state where a predetermined voltage is applied between the first pad and the second pad to investigate the fourth transistor cell, and after the inspection of the fourth transistor cell has been completed, the drive signal is selectively input to the third gate pad and the first gate pad in a state where a predetermined voltage is applied between the first pad, and the second pad to investigate the fifth transistor cell.

10. The semiconductor device according to claim 1, wherein the plurality of gate pads is short-circuited to each other after screening.

11. The semiconductor device according to claim 1, wherein the plurality of gate pads is electrically separated from each other even after screening.

12. The semiconductor device according to claim 1, wherein a drive signal is selectively input to the plurality of gate pads in a state where a predetermined voltage is applied between the first pad and the second pad to sequentially investigate the plurality of transistor cells partitioned into the plurality of types.

13. A semiconductor device, comprising:

a semiconductor substrate having a first surface and a second surface that is located opposite to the first surface in a thickness direction, and including a plurality of gate electrodes that is juxtaposed in a first direction orthogonal to the thickness direction, the adjacent gate electrodes defining a plurality of cells, and the plurality of cells including a plurality of transistor cells;

a plurality of gate wirings formed on the first surface of the semiconductor substrate acrd electrically connected to the plurality of gate electrodes;

a plurality of gate pads formed on the first surface of the semiconductor substrate and electrically connected to the plurality of gate electrodes through the plurality of gate wirings;

a first pad formed on the first surface of the semiconductor substrate and common to the plurality of transistor cells; and a second pad formed on one of the first surface and the second surface of the semiconductor substrate and common to the plurality of transistor cells, wherein the plurality of gate wirings electrically partitioned from each other is connected to the respective gate pads, the plurality of gate electrodes is electrically partitioned into a plurality of types according to the plurality of gate wirings, the plurality of transistor cells is partitioned into a plurality of types by a combination of the defined gate electrodes the plurality of transistor cells partitioned into the plurality of types is periodically arranged in the first direction, the plurality of gate pads includes a first gate pad and a second gate pad, the plurality of gate electrodes includes first gate electrodes that are electrically connected to the first gate pads, and second gate electrodes that are electrically connected to the second gate pads, the plurality of transistor cell includes a first transistor cell that is defined by a pair of the first gate electrodes, and a second transistor cell that is defined by a pair of the second gate electrodes, and the plurality of cells includes a separation cell that is defined by the first gate electrode and the second gate electrode which are adjacent to each other, and does not function as a transistor.

14. The semiconductor device according to claim 13, wherein
the separation cell forms a diode cell that is electrically connected to the first pad and the second pad.

15. The semiconductor device according to claim 13, wherein
the separation cell forms a cell that is in a floating state and is not electrically connected to the first pad.

16. The semiconductor device according to claim 13, wherein
a drive signal is selectively input to the first gate pad in a state where a predetermined voltage is applied between the first pad and the second pad to investigate the first transistor cell, and
after an inspection of the first transistor cell has been completed, the drive signal is selectively input to the second gate pad in a state where a predetermined voltage is applied between the first pad and the second pad to investigate the second transistor cell.

17. A semiconductor device, comprising:
a semiconductor substrate having a first surface and a second surface that is located opposite to the first surface in a thickness direction, and including a plurality of gate electrodes that is juxtaposed in a first direction orthogonal to the thickness direction, the adjacent gate electrodes defining a plurality of cells, and the plurality of cells including a plurality of transistor cells;

a plurality of gate wirings formed on the first surface of the semiconductor substrate, and electrically connected to the plurality of gate electrodes;

a plurality of gate pads formed on the first surface of the semiconductor substrate and electrically connected to the plurality of gate electrodes through the plurality of gate wirings;

a first pad formed on the first surface of the semiconductor substrate and common to the plurality of transistor cells; and a second pad formed on one of the first surface and the second surface of the semiconductor substrate and common to the plurality of transistor cells, wherein the plurality of gate wirings electrically partitioned from each other is connected to the respective gate pads, the plurality of gate electrodes is electrically partitioned into a plurality of types according to the plurality of gate wirings, the plurality of transistor cells is partitioned into a plurality of types by a combination of the defined gate electrodes, the plurality of transistor cells partitioned into the plurality of types is periodically arranged in the first direction, the plurality of gate pads includes the first gate pad, the second gate pad, and the third gate pad, the plurality of gate electrodes includes the first gate electrode that is electrically connected to the first gate pad, the second gate electrode that is electrically connected to the second gate pad, and the third gate electrode that is electrically connected to the third gate pad, and the plurality of transistor cells includes the third transistor cell that is defined by the first gate electrode and the second gate electrode which are adjacent to each other, the fourth transistor cell that is defined by the second gate electrode and the third gate electrode which are adjacent to each other, and a fifth transistor cell that is defined by the third gate electrode and the first gate electrode which are adjacent to each other.

18. The semiconductor device according to claim 17, wherein
a drive signal is selectively input to the first gate pad and the second gate pad in a state where a predetermined voltage is applied between the first pad and the second pad to investigate the third transistor cell,
after an inspection of the third transistor cell has been completed, the drive signal is selectively input to the second gate pad and the third gate pad in a state where a predetermined voltage is applied between the first pad and the second pad to investigate the fourth transistor cell, and after the inspection of the fourth transistor cell has been completed, the drive signal is selectively input to the third gate pad and the first gate pad in a state where a predetermined voltage is applied between the first pad, and
the second pad to investigate the fifth transistor cell.

* * * * *